United States Patent [19]
Atarashi et al.

[11] Patent Number: 5,592,363
[45] Date of Patent: Jan. 7, 1997

[54] ELECTRONIC APPARATUS

[75] Inventors: Takayuki Atarashi; Toshio Hatada, both of Tsuchiura; Takahiro Daikoku, Isehara; Nobuo Kawasaki; Toshiki Iino, both of Ibaraki-ken; Tamotsu Tsukaguchi, Hiratsuka; Kenichi Kasai, Hadano; Fumiyuki Kobayashi, Sagamihara; Yoshito Hayashi, Hadano, all of Japan

[73] Assignee: Hitachi, Ltd., Tokyo, Japan

[21] Appl. No.: 128,227

[22] Filed: Sep. 29, 1993

[30] Foreign Application Priority Data

Sep. 30, 1992 [JP] Japan .................................... 4-261086
Sep. 30, 1992 [JP] Japan .................................... 4-261118

[51] Int. Cl.⁶ .................................................... H05K 7/20
[52] U.S. Cl. .................. 361/689; 165/80.3; 165/80.4; 165/185; 257/713; 361/690; 361/699
[58] Field of Search .................................. 165/80.2–80.4, 165/104.33, 185; 174/15.1, 16.1, 16.3; 257/707, 713–714; 361/687–699, 704, 724

[56] References Cited

U.S. PATENT DOCUMENTS 4,674,004  6/1987  Smith et al. .............................. 361/393
4,777,560 10/1988  Herrell et al. ............................ 361/695

FOREIGN PATENT DOCUMENTS 2034993  2/1990  Japan .................................... 361/694

OTHER PUBLICATIONS

IBM Tech. Disclosure Bulletin, "Buffered Immerson Cooling With Buckling Bellows Providing Barrier Between Chip And System Coolant and Pressure", vol. 32, No. 8A, Jan. 1990, pp. 1–3.

Primary Examiner—Gregory D. Thompson
Attorney, Agent, or Firm—Antonelli, Terry, Stout & Kraus

[57] ABSTRACT

An electronic apparatus having a plurality of semiconductor devices which produce heat during operation, with a heat sink having a plurality of tabular or pin-type fins is provided on each semiconductor device. Nozzles are associated with the heat sinks so as to supply a cooling fluid into the heat sinks. The heat sinks are so arranged that all these heat sinks guide and discharge the cooling fluid in the same direction. A breadth of the respective nozzles, as measured in the direction (x-direction) of the flow and discharge of the cooling fluid determined by the heat sink is less than that of the associated heat sink. A width of the nozzle, as measured in the direction (y-direction) perpendicular to the x-direction is smaller than that of the associated heat sink. A space between adjacent nozzles provide a discharge passage of an ample cross-section which reduces resistance encountered by the heated cooling medium to be discharged therethrough.

10 Claims, 23 Drawing Sheets

FIG. 7A
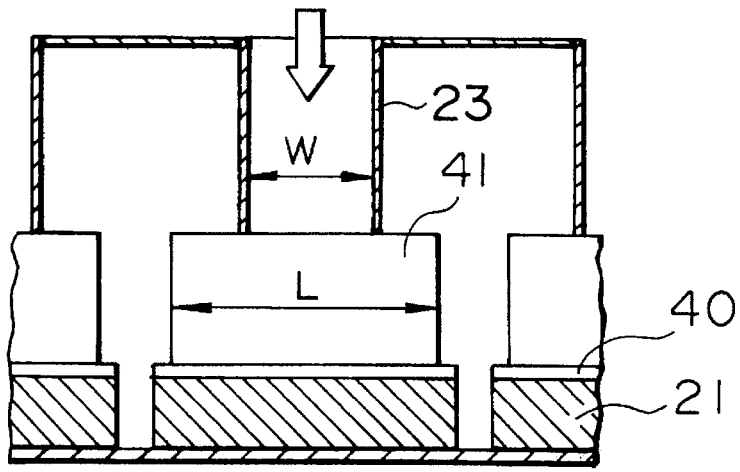
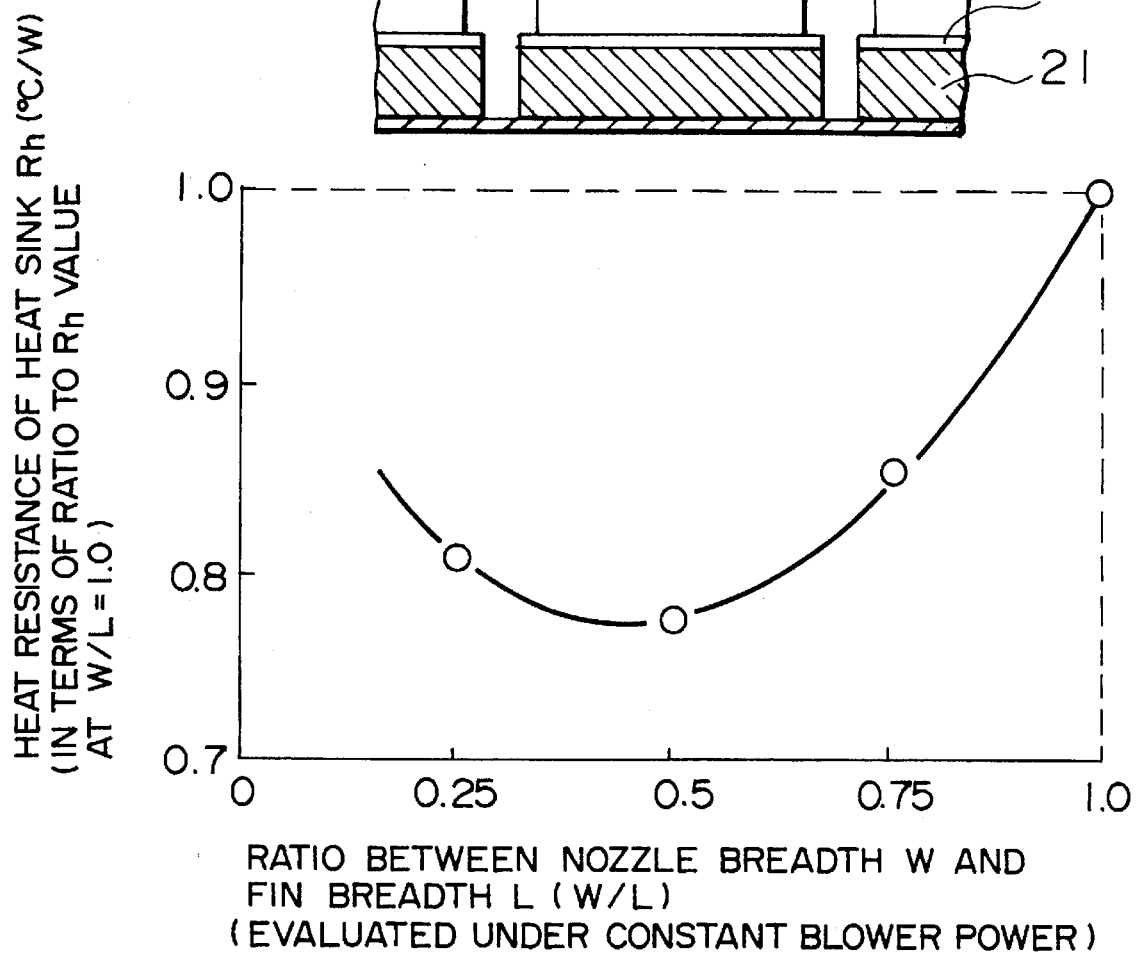
RATIO BETWEEN NOZZLE BREADTH W AND
FIN BREADTH L (W/L)
(EVALUATED UNDER CONSTANT BLOWER POWER)
FIG. 7B

ELECTRONIC APPARATUS

BACKGROUND OF THE INVENTION

1. Field of the Invention

The present invention relates to fan electronic apparatus which incorporates a plurality of heat-generating semiconductor devices and, more particularly, to an improved electronic device for cooling heat-generating semiconductor devices by a heat sink through the supply of a cooling medium such as air.

The present invention also is concerned with a cooling system which can effecting cool densely packed semiconductor devices.

2. Description of the Related Arts

Electronic apparatuses have been proposed which incorporate a plurality of heat-generating semiconductor devices mounted on a circuit board such as a printed circuit board or a ceramics board. A typical conventional system for cooling semiconductor devices employs cooling fins provided on each such semiconductor device, with cooling air supplied from one to the other side of the electronic apparatus so as to successively cool the heat-generating semiconductor devices. This conventional cooling system, however, cannot cope with the current trend for increasing rates of heat generation by the semiconductor devices in electronic apparatuses of the kind described. Namely, the cooling air after cooling upstream semiconductor devices is heated to a temperature which is too high to efficiently cool downstream semiconductor devices. Under this circumstance, in, for example, Japanese Unexamined Patent Publication 2-34993, a cooling system is proposed in which cooling fins having large heat-radiating areas and, hence, excellent cooling performance are provided on each of the heat-generating semiconductor devices and cooling air is uniformly and separately supplied, without substantial leakage of the air, to the cooling fins of the heat-generating semiconductor devices by a chamber and nozzles disposed above these fins.

Referring to FIG. 31, an electronic apparatus includes a circuit board 1 and a plurality of heat-generating LSIs 2 mounted on the circuit board 1. A heat sink 3 employing cooling fins is provided on each LSI 2, and cooling air is supplied from a chamber 4 onto the LSIs 2 through respective nozzles 5 thereby cooling the LSIs 2. After cooling the heat sink, the air is relieved into an air discharge space 8 formed between adjacent heat sinks 3 through an opening 6, and is discharged through the discharge space 8 in the direction of the arrow 7.

As shown in FIG. 32, the LSIs 2 with their heat sinks 3 are arranged in the form of a regular matrix having plural rows and columns so that air portions 9 from the heat sinks 3 of adjacent columns merge and are discharged in the same direction as indicated by an arrow 10.

Thus, in this known cooling system, each space between adjacent columns of the LSIs 2 or heat sinks 3 form an air discharge passage through which the air fractions, after cooling the semiconductor devices of the adjacent columns, are discharged to the exterior.

The current trend towards higher operation speed and higher packaging density of semiconductor devices of electronic apparatuses requires that the heat-generating semiconductor devices are arranged with a high degree of density, making it difficult to preserve ample space for discharging air between adjacent heat-generating semiconductor devices. Consequently, various problems are encountered.

More particularly, it is difficult to form an air discharge space large enough to receive and discharge air between the adjacent semiconductor devices or heat sinks. Consequently, if the cooling air is supplied to each heat sink at the required rate, the cooling air fractions from these heat sinks successively rush into the common discharge passage of the limited volume, so as to merge and form a high velocity air flow. This results in serious increase in the flow resistance encountering the flow of the air to be discharged. The increased flow velocity also may lead to higher level of fluid noise. Moreover, if the power for forcibly supplying the cooling air is limited, the rate of supply of the cooling air is reduced, thus impairing cooling performance.

The increase of the flow resistance in the air discharge passage also poses a problem that the cooling air cannot be uniformly supplied to all the heat-generating semiconductor devices, because the heat sinks which are closer to the outlet of the cooling passage can receive air at sufficiently large rates, whereas the heat sinks remote from the outlet of the cooling passage cannot be supplied with the cooling air at sufficiently large rates. Such an uneven distribution of air supply rates causes a non-uniform temperature distribution over the heat-generating semiconductor devices of the electronic device.

The above-described problems are experienced not only when the ample space large enough to form air discharge passage cannot be formed between adjacent heat-generating semiconductor devices due to too high density of mounting of these devices, but also when the heat-generating semiconductor devices generate heat at extremely large rates.

In the known electronic apparatuses, the cross-sectional area of the air discharge passage varies according to the space between the heat-generating semiconductor devices or heat sinks. Thus, the cross-sectional area is, to some extent, ruled by the arrangement of the heat-generating semiconductor devices. That is, the direction of the principal flow of the air after the cooling is materially determined by the position of the discharge opening formed in the housing of the electronic apparatus and the arrangement of the heat-generating semiconductors. In other words, it has been difficult to govern the direction of the principal flow of the air after the cooling by the structure of the heat sinks or by ducts and nozzles.

Furthermore, the illustrated known cooling system, in which the spaces formed between adjacent heat-generating semiconductor or heat sinks serve as the air passage for the air portions after cooling merge in each other, suffers from a disadvantage in that the warmed or heated air from upstream heat-generating semiconductors impinge upon the downstream heat-generating semiconductors so as to impair the cooling effect on the downstream semiconductors. Furthermore, the air warmed or heated as a result of cooling of the heat sinks tend to be directed to other portions in the electronic apparatus so as to be resuctioned by the cooling air blower or to heat other electronic components.

Nowadays, higher density of LSI packaging is required also in the field of computers, in order to meet the current demand for higher operation speed of the computers. Consequently, the density of heat generation also is increased partly because each LSI generates greater heat and partly because the density of packaging of LSIs is large. This means that the cooling of LSIs with high efficiency is becoming more important. Previously, as stated before, a conventional system for cooling semiconductor devices mounted on a circuit board such as a printed circuit board or a ceramics board employs cooling fins provided on each such semiconductor device, with cooling air supplied from one to the other side of the electronic apparatus so as to successively cool the heat-generating semiconductor devices. This conventional cooling system, however, cannot cope with the current trend for increasing rates of heat generation by the semiconductor devices in electronic apparatuses of the kind described. Namely, the cooling air after cooling upstream semiconductor devices, is heated to a temperature which is too high to efficiently cool downstream semiconductor devices. In order to obviate these problems, improved cooling systems have been proposed in, for example, Japanese Patent Unexamined Publication No. 2-34993 and Japanese Utility Model Unexamined Publication No. 1-113355 in which cooling fins having large heat-radiating areas and, hence, excellent cooling performance are provided on each of the heat-generating semiconductor devices and cooling air is uniformly and separately supplied from a blower, without substantial leakage of the air, to the cooling fins of these heat-generating semiconductor devices by means of a chamber and nozzles disposed above these fins.

FIGS. 33A and 33B show an example of such improved cooling systems, in particular a system of the type disclosed in Japanese Patent Unexamined Publication No. 2-34993, wherein, a plurality of LSIs 101, representing heat sources, are mounted on a board (not shown). A heat sink 103 composed of fins 102 is provided on each of the LSIs 101. Cooling air is supplied to each LSI 101 through a nozzle which covers the entire area of the heat sink 103 on each LSI 101 so as to cool the latter. Air, after cooling, is discharged from the heat sink 103 through openings 104. Although the cooling air is supplied and distributed uniformly over all the fins in the heat sink 103 through the nozzle which covers the entire area of the heat sink 103, a flow velocity distribution pattern is formed in the heat sink 103 such that the flow velocity is lowest in the region around the bases of the central fins, due to flow resistance, as the air flows through the gaps 102 between the fins towards the openings 104. Consequently, the chip of the LSI exhibits such a temperature distribution that the temperature is highest in the central portion of the chip. It is therefore difficult to uniformly cool each LSI chip.

In view of the above-described problem, Japanese Utility Model Unexamined Publication No. 1-113355 proposes a different air cooling system in which a cooling air entrance 105 on the upper side of the heat sink 103 is restricted so as to cover only the central region of the heat sink 103 thereby concentrating the cooling air to the central fins in the heat sink 103. In this cooling system, although the flow of cooling air is concentrated to the central region of the heat sink, a velocity gradient of the cooling air is established in the heat sink due to flow resistance as the air flows through the gaps between the fins towards openings 106 formed in both side walls of the heat sink 103. It is therefore difficult to remarkably increase the velocity of the cooling air in the region near the base ends of the fins which are disposed in the mid portion of the heat sink. In general, the point at which a fluid collides with a wall is referred to as "stagnation point". A stagnation of the fluid takes place around such a stagnation point. The velocity of fluid can never be enhanced; however, the velocity of the fluid colliding with the wall may be increased. A stagnation point exists in the mid portion of the semiconductor device 101 so as to form a temperature gradient such that the temperature is highest in the mid portion of the semiconductor device, thus failing to uniformly cool the semiconductor device.

SUMMARY OF THE INVENTION

In view of the technical problems described above, the present invention aims at providing an electronic apparatus in which, despite a very high density of mounting of heat-generating semiconductor devices on a plane or very large rates of heat generation of semiconductor devices, the flow resistance along the path of cooling air is reduced to improve cooling performance of the heat sink, while reducing the level of noise.

It is an object of the present invention to provide an electronic apparatus in which uniform flow rate distribution of a cooling medium and, hence, uniform temperature distribution, are developed over a plurality of heat-generating semiconductor devices packaged in the electronic apparatus.

It is still another object of the present invention to provide an electronic apparatus which suppresses degradation of cooling performance of downstream heat sinks due to heating of a cooling medium by upstream heat sinks.

It is a further object of the present invention to provide an electronic apparatus to prevent cooling medium heated by heat-generating semiconductor devices from coming into other sections of the apparatus, thereby eliminating reduction in the reliability of electronic parts of such sections which otherwise may be caused by introduction of the warmed cooling medium.

According to the present invention, an electronic apparatus is provided wherein a plurality of heat-generating semiconductor devices are mounted on a board, with a plurality of heat sinks being attached to corresponding heat-generating semiconductor devices in a heat conducting relation thereto. The heat sinks are arranged to determine the direction of flow and discharge of a cooling medium such as air therethrough, with a discharge chamber for enabling a passage of confluence flow of the cooling medium composed of fractions or portions of heated cooling medium emitted from the heat sinks. The heat sinks are disposed such that the directions of flow and discharge of the cooling medium through the heat sinks are substantially the same, with each heat sink being supplied with the fraction of the cooling medium through a nozzle contacting the end of the heat sink opposite to the heat-generating semiconductor device. A breadth of each of the nozzles, as measured in the direction of flow and discharge of the cooling medium through the heat sink, is less than that of the associated heat sink.

The electronic apparatus of the present invention has a plurality of heat-generating semiconductor devices which are provided with heat sinks so arranged that the directions of flow and discharge of a cooling medium through these heat sinks are the same. Nozzles are provided on sides of the heat sinks opposite to the heat-generating semiconductor devices so as to supply the cooling medium into the heat sinks. Fractions of the cooling medium discharged from the heat sinks successively join to form a confluence flow of air which flows in contact with the end surfaces of the heat sinks opposite to the heat-generating semiconductor devices along the nozzle wall surfaces which extend in the direction perpendicular to the direction of flow and discharge of the refrigerant in the heat sinks. Thus, the heated cooling medium, after heating, is discharged in a direction which is substantially perpendicular to the direction of flow and discharge in the heat sinks.

According to the invention, the width of the nozzle, as measured in the direction perpendicular to the direction of flow and discharge of the cooling medium through the heat sinks, is preferably determined to be greater than that of the heat sink. At the same time, the breadth of the nozzle, as measured in the direction of flow and discharge of the cooling medium through the heat sink, is preferably determined to be less than that of the heat sink.

Preferably, the distance between adjacent nozzles is greater, in the direction of the flow and discharge of the cooling medium through the heat sink, than in the direction perpendicular thereto.

In order to prevent the warmed cooling medium from entering other sections in the electronic apparatus, a partition wall is preferably provided so as to surround the heat-generating semiconductor devices, thus isolating other electronic components from the flow of the warmed cooling medium to be discharged, while guiding the cooling medium to a discharge outlet trough which the medium is discharged to the exterior of the electronic apparatus.

It is also preferred that the distance between adjacent heat sinks, as measured in the direction of flow and discharge of the cooling medium through the heat sink, is greater than the distance between the associated heat-generating semiconductor devices.

It is also preferred that the distance between adjacent nozzles, as measured in the direction of flow and discharge of the cooling medium through the heat sink, is greater than the distance between the associated heat sinks.

According to the present invention, there is also provided an electronic apparatus comprising a plurality of heat-generating semiconductor devices mounted on a board, with a plurality of heat sinks attached to corresponding heat-generating semiconductor devices in heat conducting relation thereto. The heat sinks are arranged to determine the direction of flow and discharge of a cooling medium such as air therethrough. A discharge chamber is provided for passage of a confluence flow of the cooling medium composed of fractions of heated cooling medium emitted from the heat sinks. The heat sinks are disposed such that the directions of flow and discharge of the cooling medium through the heat sinks are substantially the same, with each of the heat sinks being supplied with a fraction of cooling medium through a nozzle contacting the end of the heat sink opposite to the heat-generating semiconductor device. A pitch of the nozzles, as measured in the direction of flow and discharge of the cooling medium through the heat sink, is less than that of the heat sinks.

Preferably, the breadth of the heat sink as measured in the direction of flow and discharge through the heat sink is less than that of the heat-generating semiconductor device.

Preferably, the breadth of the nozzle, as measured in the direction of flow and discharge through the heat sink, is smaller than that of the heat sink.

For instance, the breadth of the nozzle, as measured in the direction of flow and discharge through the heat sink, is about ½ that of the heat sink.

Preferably, the breadth of the heat sink, as measured in the direction of flow and discharge of the cooling medium through the heat sink, progressively decreases from the end of the heat sink adjacent the heat-generating semiconductor device towards the end adjacent the chamber.

It is also preferred that the width or breadth of the nozzle for supplying the heat sink with the cooling medium, as measured in the direction perpendicular to or parallel with the direction of flow and discharge of the cooling medium through the heat sink, progressively decreasing from the upstream end towards the downstream end of the nozzle connected to the heat sink, thus forming a converging nozzle.

According to the present invention a computer is provided which comprises an electronic apparatus including a plurality of heat-generating semiconductor devices mounted on a board, with a plurality of heat sinks being attached to corresponding heat-generating semiconductor devices in heat conducting relation thereto. The heat sinks are arranged to determine the direction of flow and discharge of a cooling medium such as air therethrough, with a discharge chamber being provided for passage of confluence flow of the cooling medium composed of fractions of heated cooling medium emitted from the heat sinks. Cooling medium supplying means supply the cooling medium to the heat sinks, with a chamber for guiding the cooling medium from the cooling medium supply means to the heat sinks. A housing houses the electronic apparatus and the cooling medium supplying means, with the electronic apparatus being disposed in an upper part of the housing in a side-by-side relationship to the chamber. The cooling medium supplying means is disposed beneath the chamber, with the discharge chamber being provided on the upper side of the electronic apparatus and between nozzles through which the cooling medium is supplied to the heat sinks. The housing is provided with a cooling medium outlet formed in the upper wall thereof.

According to the invention, there is also provided a heat sink comprising a base plate and a plurality of fins provided on the base plate so as to project perpendicularly to the base plate and so as to determine the direction of flow and discharge of a cooling medium through the heat sink. A height of the fins, as measured in the direction perpendicular to the direction of flow and discharge of the cooling medium, is less at both lateral ends of the base plate than at the center of the base plate.

According to the invention, there is also provided an electronic apparatus which comprises a plurality of heat-generating semiconductor devices mounted on a board, with a plurality of heat sinks being attached to corresponding heat-generating semiconductor devices in a heat conducting relationship thereto. The heat sinks are arranged to determine the direction of flow and discharge of a cooling medium such as air therethrough, with a discharge chamber being provided for passage of confluence flow of the cooling medium composed of fractions of heated cooling medium emitted from the heat sinks. The heat sinks are disposed such that the directions of flow and discharge of the cooling medium through the heat sinks are substantially the same. The electronic apparatus further comprises a partition wall surrounding the plurality of heat sinks and nozzles contacting end surfaces of the heat sinks opposite to the heat-generating semiconductor devices so as to supply the cooling medium to the heat sinks, with the nozzles being constructed integrally with the partition wall.

Thus, in the electronic apparatus of the present invention, heat sinks are attached to respective heat-generating semiconductor devices and nozzles are provided in contact with these heat sinks. Discharge chamber or spaces are formed around the nozzles so as to provide passages for the warmed cooling medium. Therefore, even if the heat-generating semiconductor devices are arranged on a plane at such a high density that makes it possible to find ample discharge space between adjacent heat-generating semiconductor devices or between the adjacent heat sinks, it is possible to form a sufficiently large discharge air passage by using the space which confronts the upper surfaces of the heat sinks opposite to the heat-generating semiconductor devices and which extends along the nozzle wall surfaces in the direction perpendicular to the flow and discharge of the cooling medium through the heat sinks. Consequently, a major part of the confluence flow of warmed cooling medium flows along discharge passage. As a result, the flow velocity of the cooling medium to be discharged is reduced, which, in turn, reduces the flow resistance encountered by the flow of the cooling medium to be discharged, thus attaining improvement in the cooling performance of the heat sinks and reduction in the noise level. The reduction in the flow resistance also makes it possible to supply the cooling medium at a sufficiently large rate even to such heat sinks that are liable to receive the cooling medium at smaller rates due to long distance to the discharge outlet to be traveled by the cooling medium. Consequently, it is possible to realize a uniform flow rate distribution and, hence, uniform temperature distribution, over all the heat-generating semiconductor devices contained in the electronic apparatus. Furthermore, since the flow of the cooling medium repeatedly turn orthogonally or through 180° during the supply, cooling and the discharge, noise produced in the blower, heat sinks and other portions of the flow path can effectively be absorbed while the air flows along the path, whereby the electronic apparatus can operate with reduced level of noise.

It is also to be pointed out that, since the major part of the confluence flow of the warmed cooling medium flows along the space confronting the upper end surfaces of the heat sinks and extending along the nozzle wall surfaces, only a small fraction of such warmed cooling medium is allowed to contact the heat sinks and heat-generating semiconductor devices which are disposed in the downstream region, as viewed in the direction of flow of the cooling medium to be discharged. Consequently, reduction in the cooling performance of the downstream heat sinks, which otherwise may occur due to contact by the warmed cooling medium, can be advantageously avoided.

Furthermore, when the nozzles are so disposed that the distance between adjacent nozzles is greater in the direction of flow and discharge of the cooling medium through the heat sinks than in the direction perpendicular thereto, the major part of the confluence flow is formed in the space between adjacent nozzles which face each other in the direction of flow and discharge of the cooling medium through the heat sinks, rather than in the space between adjacent nozzles which face in the direction perpendicular to the direction of flow and discharge of the cooling medium in the heat sinks.

The partition wall surrounding the heat-generating semiconductor devices efficiently guides the warmed cooling medium from the heat sinks to a discharge outlet formed in the housing of the electronic apparatus. The partition wall also prevents the warmed cooling medium after the heat exchange from entering other sections of the apparatus which do not require cooling, thereby eliminating undesirable effects which otherwise may be caused on electronic components contained in these sections.

In one form of the invention, the distance between adjacent heat sinks as measured in the direction of flow and discharge of the cooling medium through the heat sinks is determined to be greater than the distance between the adjacent heat-generating semiconductor devices as measured in the same direction. Consequently, the spacing between the opposing end surfaces of adjacent heat sinks is increased, so as to reduce flow resistance against the cooling medium which is going to turn 180° and to enter the discharge space confronting the upper end surfaces of the heat sinks and the nozzle wall surfaces, after the cooling medium has been discharged from the heat sinks. The flow resistance against the cooling medium making the 180° turn is further enhanced when the height of the fins of the heat sink is the highest in the central region and decreases towards both lateral ends, because such a height variation of the fins progressively increases the distance between the end surfaces of adjacent heat sinks upward towards the above-mentioned discharge passage.

In one form of the invention, the position of the nozzle with respect to the associated heat-generating semiconductor device is such that the nozzle is offset from the center of the heat-generating semiconductor device towards the center of the electronic apparatus, and the amount of the offset is so varied according to the position of the semiconductor device that the offset amount is greatest on the semiconductor devices which are in the outermost region of the electronic apparatus and progressively decreases towards the center of the electronic apparatus. Consequently, the rate of supply of the cooling medium is intentionally reduced for the heat sinks in the outermost region, which otherwise may receive cooling medium at a greater rate due to smaller flow resistance than in other heat sinks, whereby a uniform flow rate distribution of the cooling medium is attained.

The converging form of the nozzle reduces the flow resistance against the cooling medium entering from the chamber into the nozzle, thereby ensuring smoother flow of the cooling medium into the nozzle.

In the computer in accordance with the present invention, the electronic apparatus is mounted in an upper part of the housing in side-by-side relationship to the chamber, and the cooling medium supplying means is disposed beneath the chamber. A discharge chamber is formed on the upper side of the electronic apparatus and the nozzles, with a discharge opening formed in the top wall of the housing. Consequently, cooling medium, such as air of comparatively low temperature, is suctioned from a lower region near the floor of a room and naturally flows upward as it is progressively heated to become lighter, whereby a high cooling efficiency is attained while avoiding introduction of the warmed cooling medium into sections other than the heat-generating semiconductor devices.

In one form of the invention, the height of the fins of the heat sink progressively decrease from the central region towards both lateral end regions of the heat sink, so that the flow resistance encountered by the cooling medium flowing in the heat sink is reduced correspondingly, thereby contributing to improvement in the heat dissipation efficiency.

In one form of the present invention, the nozzles are integrated with the partition wall so that nozzles can easily and precisely be located with respect to the heat-generating semiconductor devices, thereby making it possible to preserve the required discharge spaces. At the same time, protective maintenance on the electronic apparatus is facilitated.

In view of the technical problems described above, the present invention provides a cooling apparatus for cooling heat-generating units such as semiconductor LSIs, with high degree of uniformity of temperature distribution and at a high cooling efficiency. More particularly, the present invention is directed to a cooling apparatus for use in a computer in which many LSI chips, each generating great heat, are densely mounted in a multi-chip module in order to meet a current demand for higher processing speed of the computer, and is aimed at enabling these LSI chips to be uniformly cooled with a cooling fluid such as air.

It is also an object of the present invention to provide a clamping device which enables a high-performance heat sink to be securely attached to a heat-generating unit such as a multi-chip module, while reducing leakage of cooling fluid from the heat sink.

It is also an object of the present invention to provide a nozzle connecting structure which enables the supply of a cooling fluid to a heat sink, without burdening the electrical circuit connection to the heat-generating unit such as multi-chip module, while reducing leakage of the cooling fluid.

To this end, according to the present invention, a cooling apparatus employs a heat sink associated with a heat-generating unit, with the heat sink being provided in its central region with a slit extending from the mop end to the base end of the heat sink, so that the cooling fluid supplied from the upper side of the heat sink can directly reach the upper side of the center of the heat-generating unit without being decelerated and without raising its temperature.

In one form of the invention, the heat sink is provided therein with a flow guide which positively guides the cooling fluid supplied from the upper side of the heat sink to the central region of the heat sink.

In one form of the present invention, a clamping device has a force-adjustable leaf spring received in the slit formed in the heat sink and an L-shaped clamping member combined with the leaf spring, with the L-shaped clamping member being secured to both side faces of the heat sink. A support is provided on the bottom surface of the heat-generating unit such as a multi-chip module. By using this clamping device, it is possible to mount a high-performance heat sink to a heat-generating unit such as a multi-chip module, with a high degree of reliability while saving the mounting space. In addition, the L-shaped clamping member effectively prevents the cooling fluid from flowing out the slit in the heat sink.

The cooling apparatus of the present invention also may be such that the heat sink and the nozzle for supplying the cooling fluid to the heat sink are not integrally connected to each other, but the nozzle is inserted into a nozzle insertion opening formed in the upper end of the heat sink, through the intermediary of a soft buffering member placed therebetween, whereby the nozzle is connected to the heat sink without mechanically burdening the electrical connection to the heat-generating unit such as a multi-chip module, while diminishing the leakage of the cooling fluid.

Thus, according to the present invention, a vertical slit is formed in the central region of a heat sink which cools a heat-generating unit, so as to extend from the top end down to the base end of the fins of the heat sink. When the cooling fluid is jetted to the heat sink from the upper side thereof, the portion of the cooling fluid entering the slit encounters less resistance than the remaining portion of the cooling fluid which passes through gaps between the fins. Consequently, the portion of the cooling fluid entering the slit can directly reach the fin base region on the central portion of the heat-generating unit without substantially reducing its velocity. In addition, this portion of the cooling fluid does not exhibit substantial temperature rise because it does not pass through the spaces between the fins. Thus, the fin base region on the center of the heat-generating unit can receive the cooling fluid of low temperature. It is therefore possible to locally enhance the cooling effect in the region near the center of the heat-generating unit and to obtain a uniform temperature distribution over the heat-generating unit such as an LSI module, while effectively cooling such a heat-generating unit. Thus, the present invention makes it possible to uniformly cool, by using an easily available cooling fluid such as air rather than water or other specific cooling medium, many LSI chips in a multi-chip module in which many LSIs, each generating great heat, are arranged at a high density to meet the current demand for higher processing speed of a computer.

According to the invention, the cooling apparatus can employ at least one set of flow guide elements provided in the heat sink so that the cooling medium supplied from the upper side of the heat sink is positively and concentrically guided to the fin base regions on the central portion of the heat-generating unit where the heat build-up and, hence, the cooling demand are greatest. It is therefore possible to concentrically cool the fin base region on such central portion of the heat-generating unit. A greater degree of uniformity of temperature distribution and, therefore, a higher cooling efficiency, can be obtained by suitably determining the positions of the flow guide elements in accordance with the distribution of heat generation rate over the heat-generating unit.

Furthermore, according to the present invention, the high-performance heat sink having the slit is securely attached to the heat-generating unit such as a multi-chip module, without impairing the cooling performance of the heat sink, by a clamping device which is composed of a leaf spring received in the slit and an L-shaped clamping member having a support on the bottom surface of the heat-generating unit. The L-shaped clamping member effectively prevents the cooling medium from scattering to the exterior of the slit, thereby avoiding any reduction in the cooling performance.

BRIEF DESCRIPTION OF THE DRAWINGS

FIG. 7A is a schematic cross-sectional view of an optimum width of a nozzle incorporated in the embodiment of FIG. 1;

FIG. 7B is a graphical illustration of the relationship between the ratio of nozzle width and fin breadth to heat resistance of a heat sink;

DESCRIPTION OF THE PREFERRED EMBODIMENTS

Figure 1:
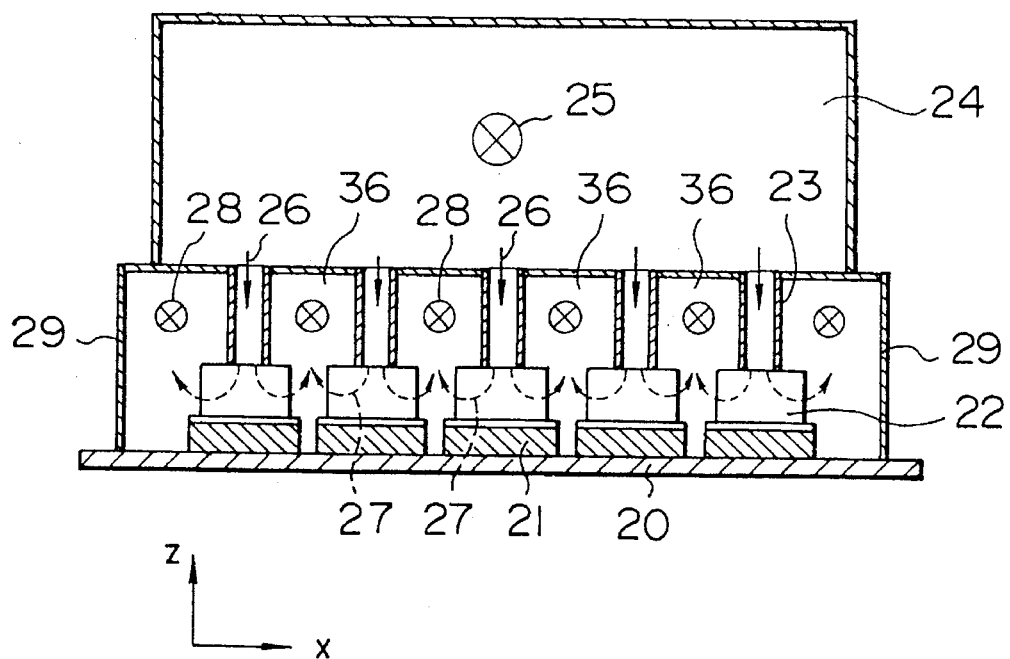
FIG. 1 is a sectional bottom plan view of an embodiment of an electronic apparatus in accordance with the present invention.

As shown in FIG. 1, a board 20, such as a printed circuit board or a ceramics board, carries a plurality of heat-generating semiconductor devices 21, typically electronic circuit modules having one or more LSIs, arranged densely in close proximity to one another. Each semiconductor device 21 is provided on the upper side thereof with a heat sink 22 which effectively transfers heat from the semiconductor device 21 to cooling air. The heat sink 22 includes, for example, a plurality of tabular fins arranged side by side and the spaces defined between the adjacent fins determine the directions of flow and discharge of the cooling air. Preferably, the heat sink is made of a material having large heat conductivity, such as copper, aluminum or heat-conductive ceramics.

The heat sink 22 is integrated with the associated semiconductor device 21 in a heat-conducting relationship therewith through, for example, a heat-conducting grease, heat-conducting sheet or a heat-conducting adhesive. A nozzle 23 is hermetically connected to the side of each heat sink 22 opposite to the circuit board, for example, to the upper surface of the heat sink 22, as viewed in FIG. 1, so as to supply cooling air into the heat sink 22 without any leakage. Thus, the electronic apparatus has a plurality of such nozzles 23 which communicate with a common chamber 24 which distributes air from an air supplying means such as a blower (not shown) to the nozzles 23. The cooling air 25 is supplied by the blower into the chamber 24 in the direction represented by a mark x surrounded by a circle, which indicates that the air flows in the direction perpendicular to the plane of FIG. 1 from the obverse side to the reverse side. The flow of air 25 is then divided into fractions or portions 26 which are supplied into the respective nozzles 23 and then into the heat sinks 22 so as to flow therethrough as indicated by arrows 27. The cooling air thus introduced into the heat sink 22 collides with the heat-generating semiconductor device 21 to turn sideways into the discharge spaces 36 on both sides of the semiconductor device 21. The air flows, after cooling, discharged from the heat sinks, successively merge into one another to form a discharge air flow 28 directed towards an outlet.

Figure 2:
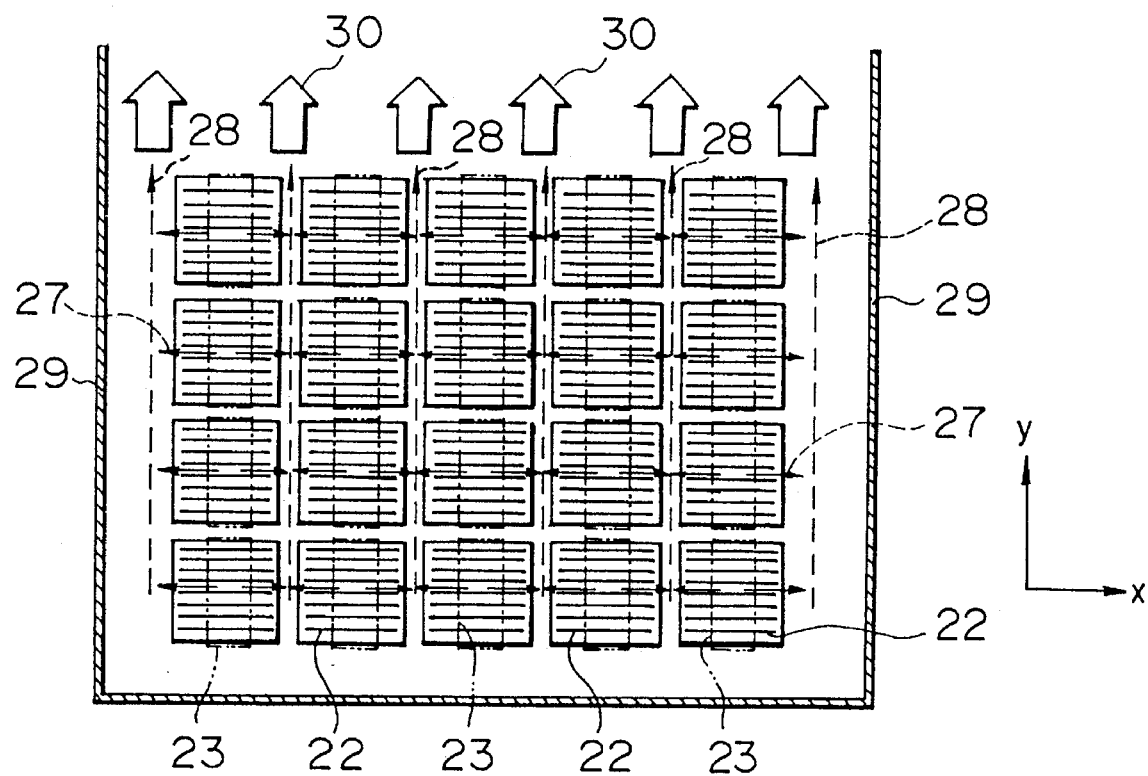
FIG. 2 is a sectional front elevational view of the embodiment shown in FIG. 1.

As shown in FIG. 2, the heat-generating semiconductor devices 21 and, hence, the heat sinks 22, are densely arranged in the form of a matrix composed of lines, and columns, in close proximity of one another. The flow 27 of cooling air supplied through the nozzle 23 is directed to the central portion of the heat sink 22 and, upon collision with the bottom surface of the heat sink 22, shunts to left and right directions as viewed in FIGS. 1 and 2 so as to be discharged from the heat sink 22. The heat sinks 22 are arranged so that the directions of the air flow 27 in these heat sinks 22 are parallel to each other.

In the illustrated embodiment, the flow of the air in each heat sink 22 is governed by the tabular fins. Therefore, the heat sinks 22 are so arranged in the heat-generating semiconductor devices that their fins extend in parallel with one another. As shown in FIG. 2, the width of the nozzle, in the y-direction perpendicular to the flow 27 of the air in the heat sink 22, is greater than that of the heat sink 22, whereas, the nozzle width in the x-direction, parallel to the direction of flow 27 of the air in the heat sink 27, is less than that of the heat sink 22. The fractions or portions of air coming out of the heat sinks 22 successively join to form a confluence flow 28 of discharge air which is then discharged through the discharge space 36 so as to be discharged to the exterior of the housing as indicated by the arrows 30. The direction of the confluence flow 28 of discharge air is substantially orthogonal to the x-direction in which the cooling air 27 is made to flow through and discharged from the heat sink 22.

In the illustrated embodiment, a group of heat-generating semiconductor devices 21 includes twenty semiconductor devices which are arranged in five columns each containing four semiconductor devices 21. This group of heat-generating semiconductor devices 21 is surrounded by partition walls 29 which guide the air from the heat sinks 22 to the discharge outlet connected to the housing of the electronic apparatus. The partition walls 29 also serve to isolate other components of the electronic apparatus from the warmed or heated air discharged from the heat sinks 22. When the rate of generation of heat from each heat-generating semiconductor device is large, the air discharged from the heat sink 22 naturally has a higher temperature. In addition, the flow velocity also is greater because the air is supplied to the heat-generating semiconductor device 21 at a greater rate to carry the heat away at the correspondingly greater rate. Therefore, any leakage of the heated cooling air to other portions of the electronic apparatus undesirably elevates the temperatures of other electronic components, thereby impairing the reliability of the entire apparatus. Thus, the partition walls 29 constitute an effective means for improving the reliability. The partition walls also serve to effectively prevent dust from scattering to other components of the electronic apparatus.

Figure 3:
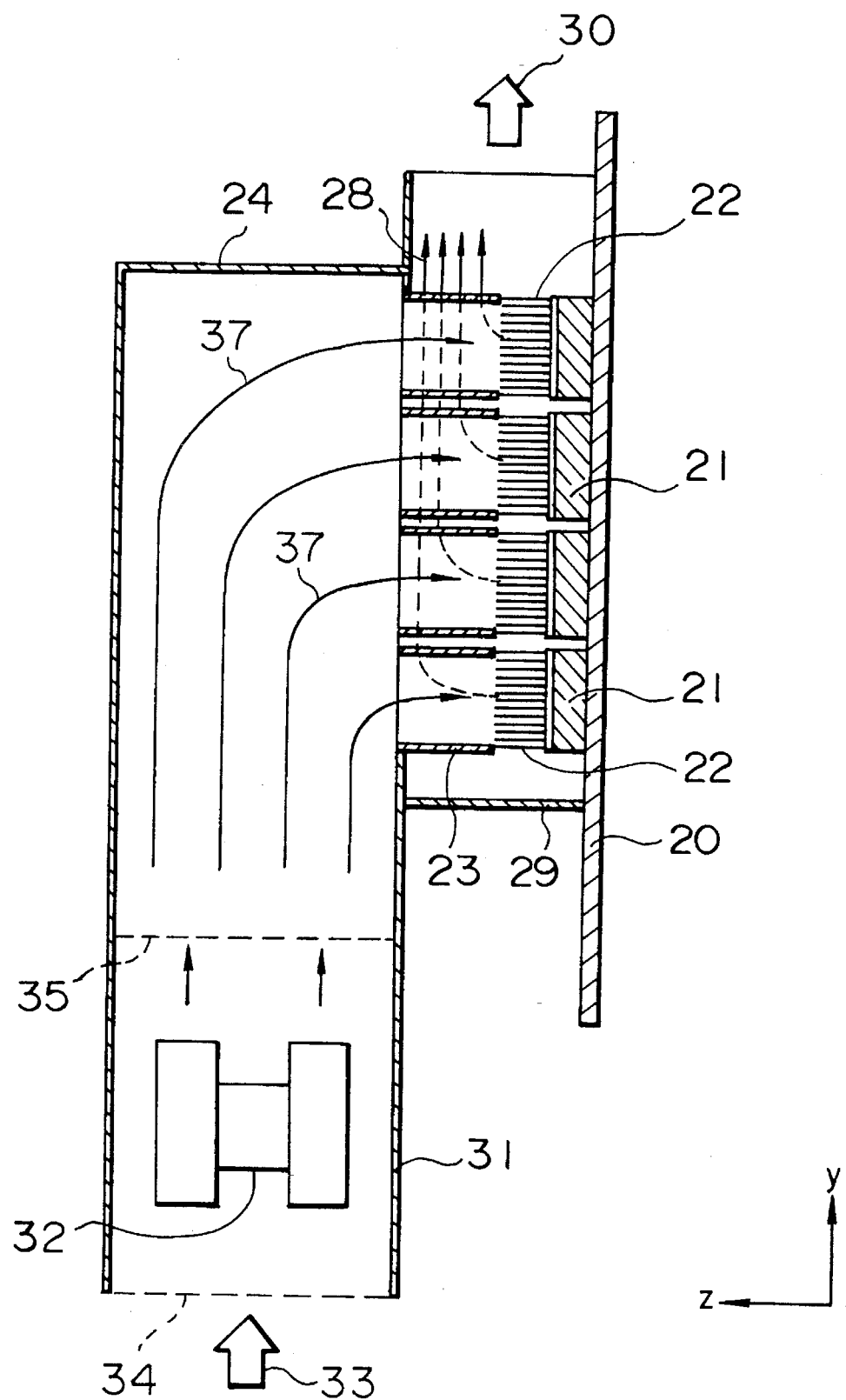
FIG. 3 is a sectional side elevational view of a portion of the embodiment shown in FIG. 1.

As shown in FIG. 3, a common chamber 24 overlies the nozzles 23 through which the cooling air is supplied to the respective heat sinks 22. A blower box 31 containing a blower 32 is connected to the chamber 24. Air 33 is suctioned by the blower 32 through an air filter 34 and is pressurized by the blower 32 and forced into the chamber 24 through a flow rectifying plate 35 which provides a uniform flow velocity distribution in the cross-section of the air duct leading to the chamber 24. The air introduced into the chamber 24 then shunts into fractions or portions 37 which are introduced into the respective nozzles 23 thereby cooling the heat sinks 22. The air introduced into the heat sink 22 makes a turn so as to rush into the discharge spaces defined between adjacent nozzles 23 so as to join in the fractions or portions of air from the upstream and downstream heat sinks 22, thus forming a confluence flow 28 which is then discharged through the electronic apparatus as indicated by the arrow 30.

Thus, in the illustrated embodiment, the fractions or portions of the cooling air discharged from a plurality of heat sinks join one another to form a confluence flow 28, with the major part or portion flowing along one end surface of the heat sink 22 extending perpendicularly (in the y-direction) to the nozzle 23, for example, the upper end surfaces of the fins and along the walls defining the nozzles. That is to say, the air forming the major part or portion of the confluence flow 28 flows along and is discharged through the discharge spaces 36 which are defined between adjacent nozzles 23. Consequently, the heat-generating semiconductor devices 21 can be arranged in a plane on the board with a very high density. Such a dense arrangement of the heat-generating semiconductor devices 21 makes it difficult to preserve ample space between the adjacent heat-generating semiconductor devices or heat sinks for the discharge of the cooling air after the cooling. In the illustrated embodiment, however, it is possible to preserve discharge spaces 36 of a size large enough to smoothly guide and discharge the cooling air, between the adjacent nozzles 23.

Thus, in the illustrated embodiment, the major part or portion of the air forming the confluence flow 28 is discharged through the discharge space 36 of an ample cross-section, so that the flow velocity of the confluence flow 28 correspondingly decreases. Consequently, the resistance to flow of the air to be discharged is reduced, thus offering an improvement in the cooling performance of the heat sink and reduction in the level of the noise. In the conventional cooling arrangement, supply of cooling air is often insufficient to heat sinks 22 which are remote from the discharge outlet, due to the large distance between the heat sinks 22 and the outlet. In the illustrated embodiment, however, this problem is eliminated because the cooling air can well be distributed to the heat sinks 22 remote from the discharge outlet, by virtue of the reduced flow resistance encountered by the flow of air to be discharged. Consequently, a more uniform distribution of the cooling air flow rate and, as a result, a more uniform temperature distribution are attained over the heat-generating semiconductor devices 21 of the electronic apparatus.

Build-up of heat takes place when each heat-generating semiconductor device 21 produces much heat, even if the mounting density of the heat-generating semiconductor devices 21 is not so large. In the illustrated embodiment, however, this tendency is greatly suppressed because both the spaces formed between adjacent heat sinks 22 and the discharge spaces 36 by the upper end surfaces of the heat sink 22 and the nozzle walls are available as the passage for discharging the heated cooling air. Consequently, the resistance encountered by the flow of the air to be discharged is reduced to enable the flow rate of the cooling air to be increased, thus attaining improved cooling performance of the heat sinks 22 and reduction in the level of the noise.

Furthermore, since the air which forms the major part or portion of the confluence flow 28 flows along the discharge space 36 which are formed between adjacent nozzles, only a small portion of the heated air from the upstream semiconductor devices is allowed to impinge upon the downstream semiconductor devices as viewed in the direction of flow of the air to be discharged, so that any reduction in the cooling effect on the downstream semiconductor devices 21, which previously has been caused by the contact of the heated air with the downstream semiconductor devices 21, can be sufficiently suppressed.

In FIG. 3, the electronic apparatus is so situated that the circuit board 20 extends vertically and the cooling air flows from the lower side to the upper side. Obviously, however, the electronic apparatus may be so positioned that the circuit board 20 extends horizontally, as shown in FIG. 1.

As shown in FIG. 2, the spacing between the adjacent nozzles 23 is greater in the x-direction which coincides with the direction of flow and discharge of the cooling air in the heat sink 27 than in the y-direction which is perpendicular to the x-direction. Consequently, a major part or portion of the confluence flow 28 of the air after cooling naturally flows through the space formed between the adjacent nozzles 23 in the x-direction rather than the space formed between the adjacent nozzles 23 in the y-direction. Therefore, the direction of the confluence flow 28 of the cooling air is determined by the structure of the heat sinks 22 or by the construction of the duct and nozzles, which conveniently facilitates design of the cooling air passages.

In the illustrated embodiment, the cooling air supplied by the blower 32 makes a turn through 90° in the chamber 24 before shunting into fractions or portions 37 which flows into the respective nozzles 23. Furthermore, the flow 27 of the cooling air in each of the heat sinks 22 makes a substantially 180° turn into the discharge space 36. The flow of air then makes a 90° turn in the discharge space 36 and fractions or portions of such air flow from the respective heat sinks 22 join successively to form the confluence air flow 28. Thus, the flow of the cooling air repeatedly makes turns so that the noise produced by the blower 32 and the noise generated while the air flows through the heat sinks 22 and spaces are absorbed within the discharge space without being exhausted to the exterior of the housing. It is thus possible to obtain an electronic apparatus operable at a lower noise level.

Figure 4:
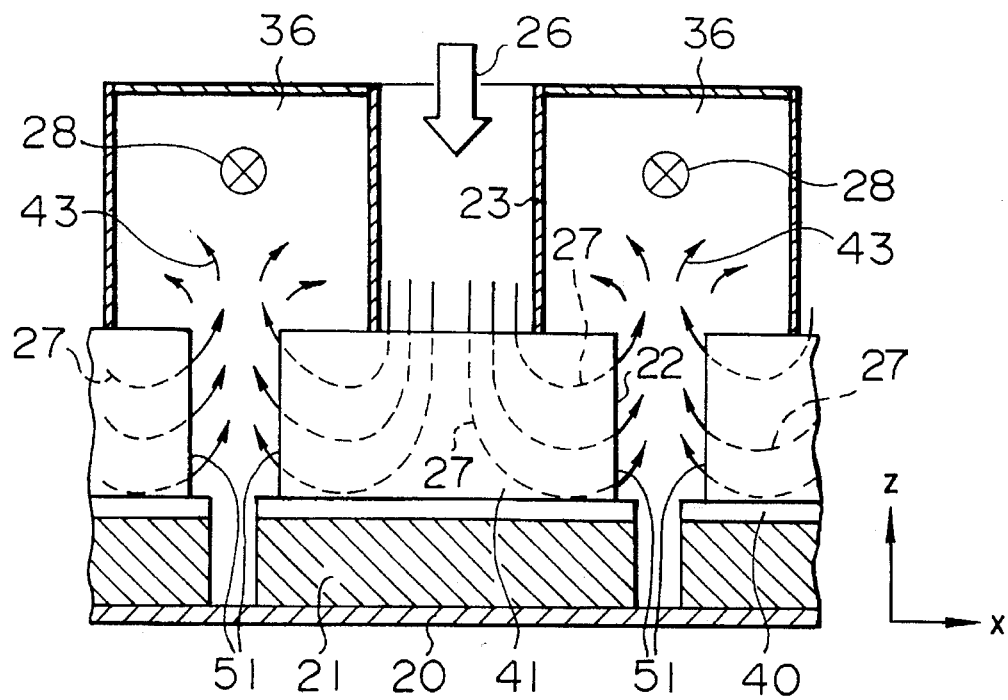
FIG. 4 is an enlarged view of the embodiment shown in FIG. 1, showing particularly a heat sink in a greater scale.
Figure 5:
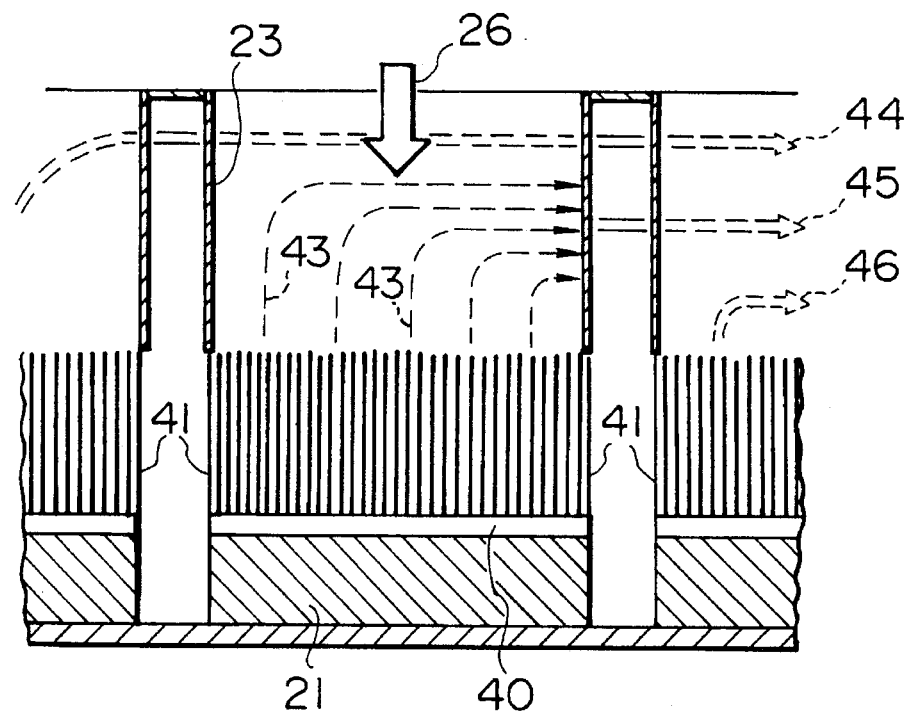
FIG. 5 is a sectional view taken along a plane orthogonal to the plane of FIG. 4.
Figure 6:
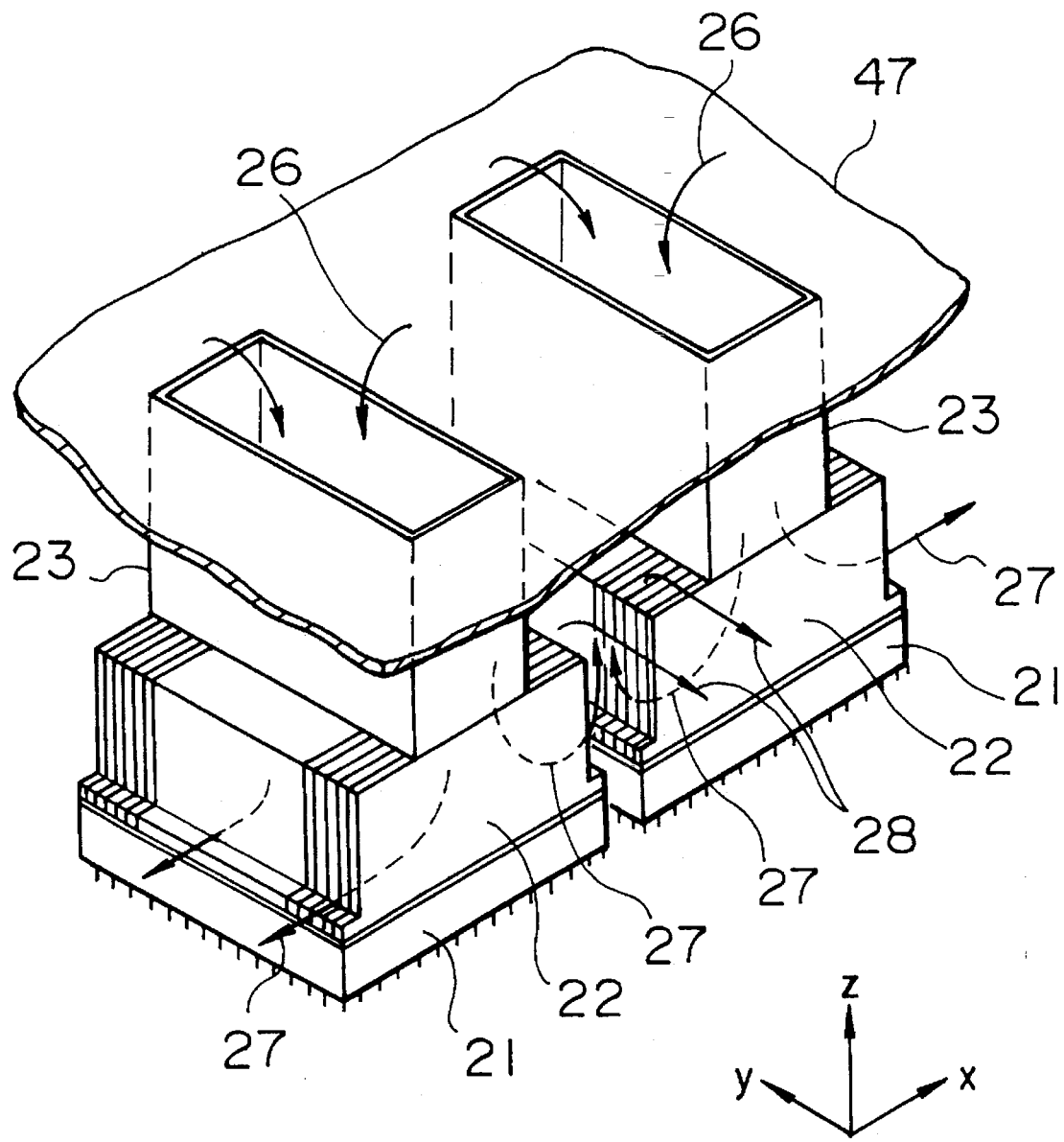
FIG. 6 is a perspective view of a heat sink incorporated in the embodiment shown in FIG. 1.

FIG. 4 illustrates a portion around the heat sink 22, as viewed in the y-direction which is perpendicular to the direction of flow and discharge of the air in the heat sink, with FIG. 5 illustrating a portion around the heat sink, as viewed in the x-direction which is parallel to the direction of flow and discharge of the air through the heat sink, and with FIG. 6 illustrating two adjacent heat sinks 22.

As shown in FIGS. 4–6, the heat sink 22 includes a base plate 40 and fins 41 which are joined to the base plate 40 at a regular interval by, for example, soldering, brazing or caulking. Alternatively, the fins 41 may be formed integrally with the base plate 40 by machining or extrusion.

The cooling air 26 from the nozzle enters the spaces between the adjacent fins 41 at a high velocity so as to form the flow 27 which reaches the region near the base plate 40. The cooling air then emerges into the spaces defined between adjacent heat sinks 22. The fractions or portions of air thus emitted from the respective heat sinks 22 of an array successively join one another to form a confluence air flow 43 through the discharge spaces 36 which are defined between adjacent nozzles. The confluence air flow 43 then joins together with the confluence air flow 44 from the heat sinks 22 which are disposed upstream and also with the confluence air flow 44 from the heat sinks 22 which are disposed downstream of the above-mentioned array of heat sinks, so as to be discharged to the exterior of the electronic apparatus.

As shown in FIG. 2, the width of the nozzle 23 as measured in the y-direction perpendicular to the direction of the flow 27 of air in the heat sink 22 is determined to be equal to or greater than the width of the heat sink 22 as measured in the y-direction, otherwise the fins 41 which are not covered by the nozzle 23 will fail to receive the cooling air. The breadth of the nozzle 23, as measured in the x-direction parallel to the direction of the flow 27 of the air in the heat sink, is less than that of the heat sink 22 as measured in the x-direction. This feature offers the following advantages. First, the flow velocity of the air in the nozzle is increased due to reduction in the cross-sectional area of the nozzle, so that the air can reach the region around the fin bases where the difference in the temperature between the cooling air and the fins 41 is large, thus enhancing the heat exchange efficiency. In addition, the air from the restricted nozzle forms a jet which dynamically flows into the spaces between the fins 41 so as to improve the rate of heat transfer to the air. Thus, the cooling performance of the heat sink 22 is enhanced. Secondly, the x-direction spacing between adjacent nozzles 23 is increased by virtue of the reduced x-direction breadth of the nozzle 23, thus providing a greater size of the discharge space 36 formed between adjacent nozzles 23, contributing to the reduction in the flow resistance encountered by the flow of the cooling air to be discharged.

As shown in FIG. 4, the breadth of the fins 41 as measured in the x-direction is less than that of the base plate 40, so that the spacing between the discharge end surfaces 51 of adjacent heat sinks 22 as measured in the x-direction parallel to the direction 27 of flow and discharge of the air through the heat sink 22 is greater than the spacing between the heat-generating semiconductor devices 21 in the same direction. This arrangement effectively reduces the resistance encountered by the air from the discharge end surface 51 of each heat sink 22 when the air joins together with the air discharged from the opposing discharge end surface 51 of the adjacent heat sink 22, and ensures smooth introduction of the air after cooling into the discharge space 36.

As has already been described, the cooling performance of the heat sink 22 is improved by making the breadth of the nozzle 23 less than the breadth of the heat sink 22 as measured in the x-direction parallel to the direction 27 of flow and discharge of the air through the heat sink 22.

Referring to FIGS. 7A and 7B, to optimize the x-direction breadth with respect to the x-direction breadth of the heat sink 22, the of abscissa represents the ratio W/L between the nozzle breadth W (mm) and the heat sink breadth L (mm) as measured in the x-direction parallel to the direction of flow of air in the heat sink, while the ordinate represents a dimensionless value which is obtained by dividing the heat resistance Rh (°C./W) of the heat sink by the Rh value obtained when W/L=1.0. The data shown in FIG. 7A were obtained through measurement conducted under a constant air supplying power. As shown in FIG. 7A, the heat resistance is minimum when the ratio W/L is around 0.5. It is thus understood that the performance of the heat sink is maximized when the nozzle breadth is set to a value substantially half (½) that of the heat sink as measured in the x-direction.

Figure 8:
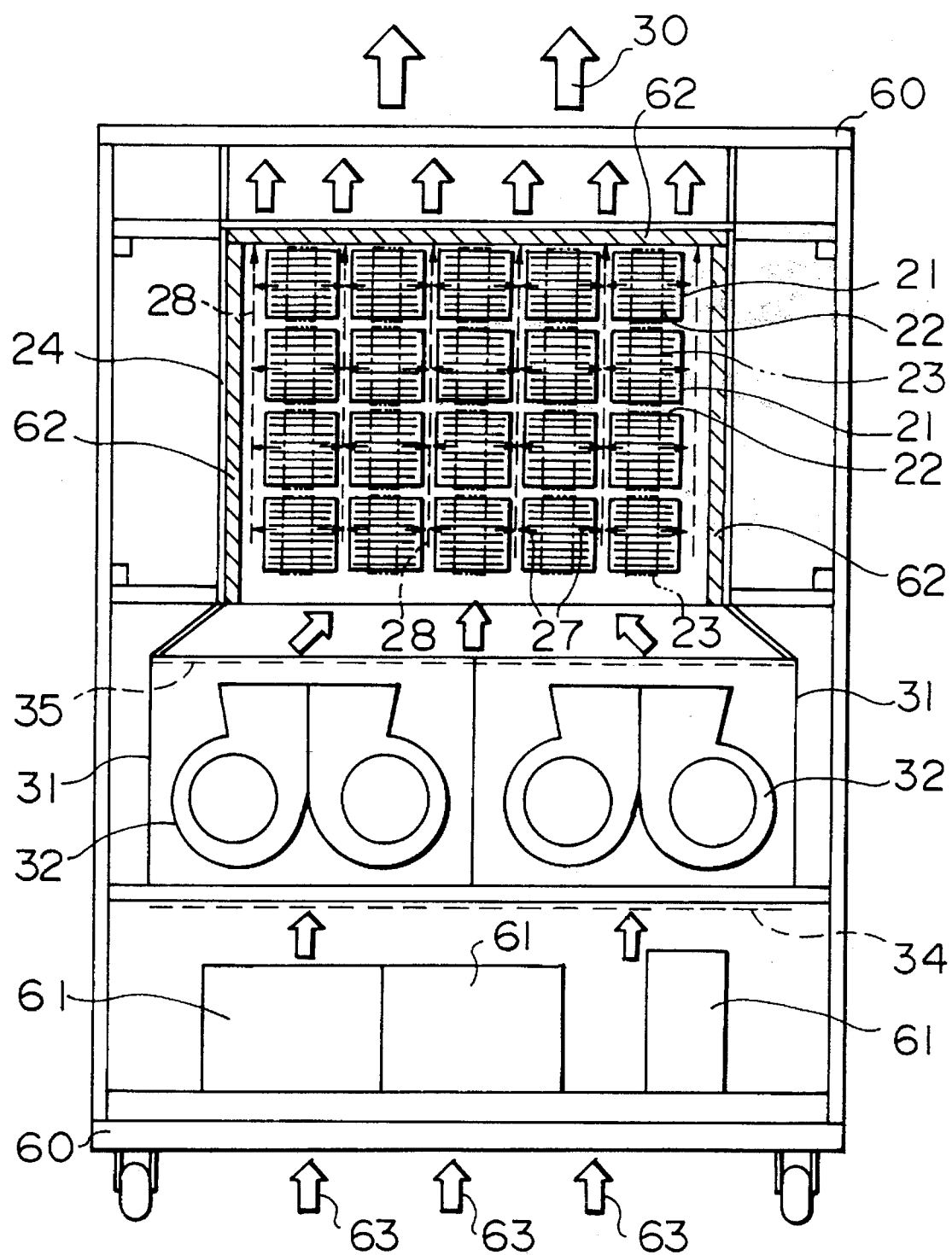
FIG. 8 is a sectional front elevational view of another embodiment of the electronic apparatus in accordance with the first aspect of the present invention.
Figure 9:
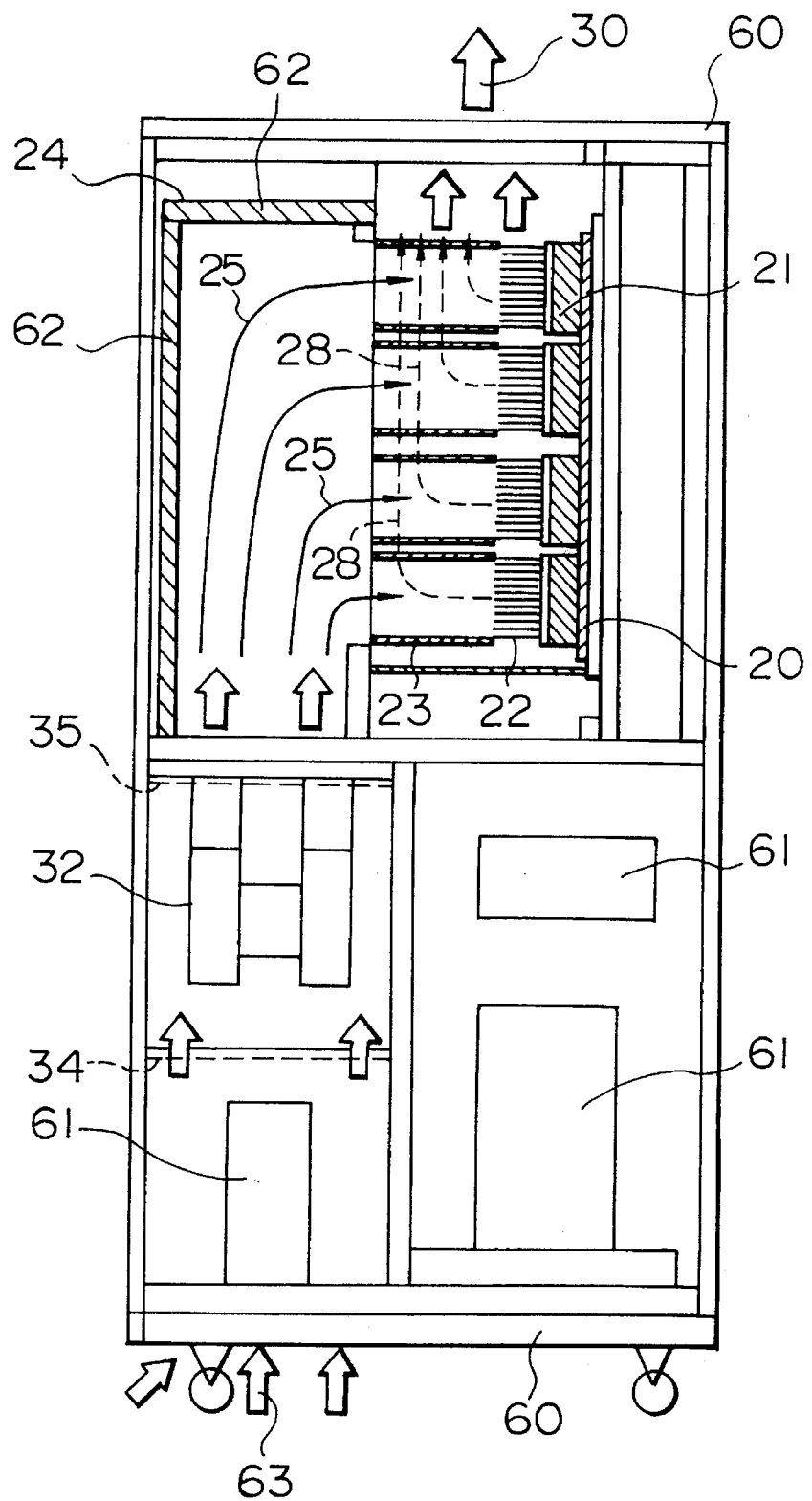
FIG. 9 is a sectional side elevational view of the embodiment of FIG. 8.

Referring now to FIGS. 8 and 9, a frame 60 carries a base plate 20, a chamber 24, a blower box 31 and electronic parts 61 other than the electronic apparatus to be cooled. Although not shown, outer panels are attached to the frame 60 so as to form a housing so that the interior of the housing is isolated from the exterior. Cooling air is induced from the region near the floor of a room where the air temperature is comparatively low. If an under-floor air-conditioning system is used, conditioned cooling air is preferably introduced directly from the under-floor space. The air is thus inducted by the blower 32 in the blower box 31 and flows through a filter 34 to remove dust which may cause various problems when introduced into the housing.

The air pressurized by the blower 32 is forced into the chamber 24 past a flow rectifying plate 35 which produces a uniform flow velocity distribution over the entire cross-section of the air duct. The entire inner surface of the chamber 24 is lined with a sound absorbing material 62. The cooling air is then introduced from the nozzle 23 into each heat sink 22 so that heat is exchanged in the heat sink 22 between the cooling air and the fins. The air after the heat exchange forms confluence air flow 28 as in the first embodiment, so as to be discharged towards the ceiling. Thus, in the second embodiment of the present invention, the air inlet, blower 32, heat sink 22 and the discharge outlet are arranged linearly straight to cause the air from the lower end to the upper end, thus smoothing the flow of air in the housing of the electronic apparatus. Thus, the cooling performance is improved because the flow resistance in the electronic apparatus is reduced and because cooling air of a lower temperature is used. The smooth flow of the cooling air also lowers the level of the noise generated in the housing.

In the first and second embodiments described above, the heat-generating semiconductor devices 21 are arranged in a matrix form having five rows as counted in the horizontal direction and four rows as counted in the vertical directions. Obviously, this arrangement may be modified such that the matrix has four rows in the horizontal direction and five rows in the vertical direction. It will also be clear that each row of the matrix arrangement may lack one or more heat-generating semiconductor devices. Furthermore, although the heat sinks 22 used in the first and second embodiments employ tabular fins 41, this is only illustrative and the invention can be carried out by using any other suitable type of heat sinks provided that the heat sink can govern the direction of flow and discharge of the cooling air, for example, heat sinks having pin-type heat dissipating members.

Figure 10:
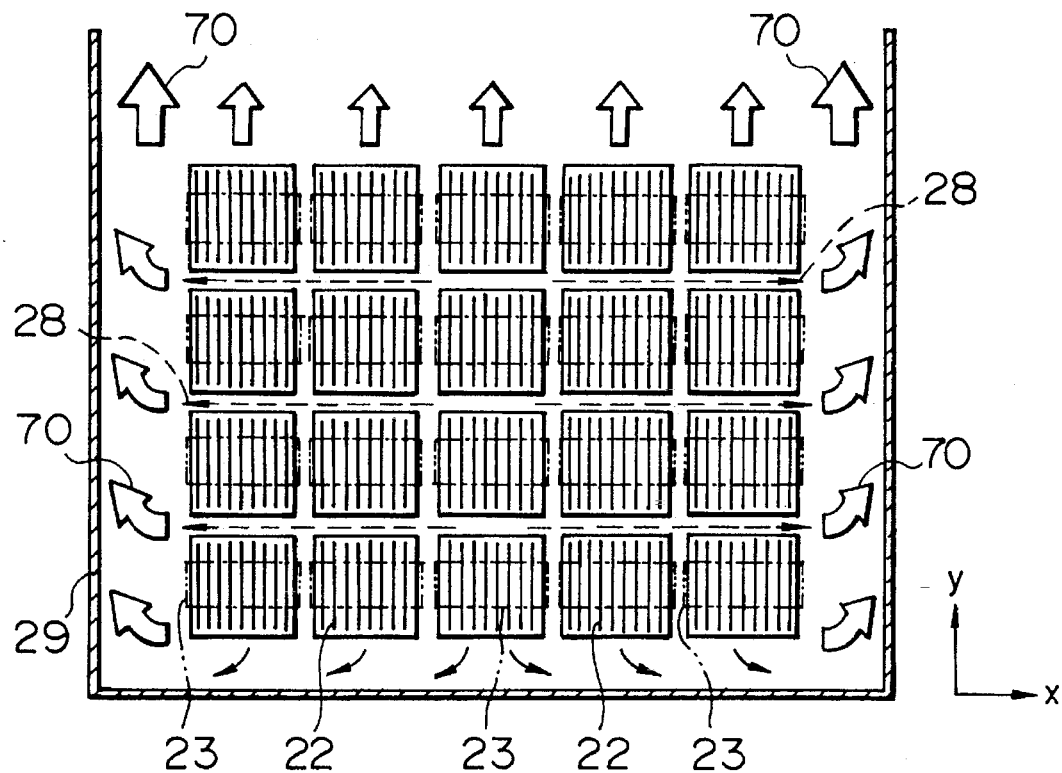
FIG. 10 is a sectional front elevational view of still another embodiment of the electronic apparatus in accordance with the present invention.
Figure 11:
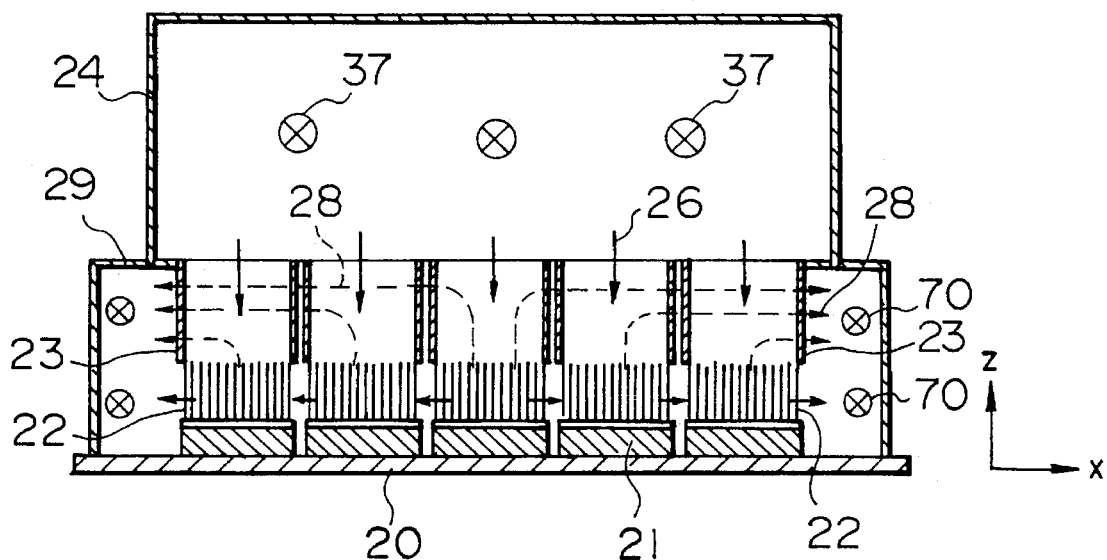
FIG. 11 is a sectional bottom plan view of the embodiment of FIG. 10.
Figure 12:
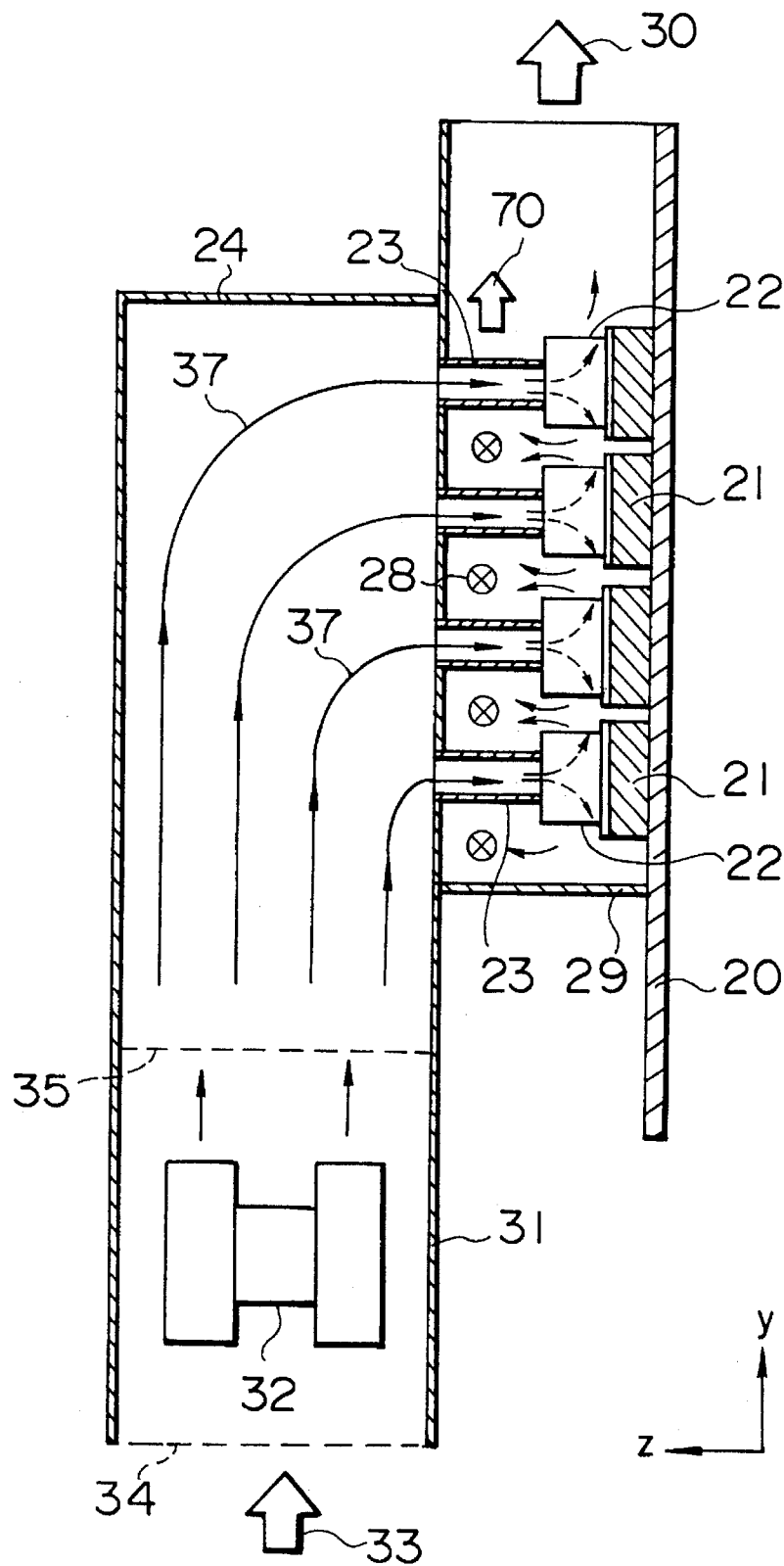
FIG. 12 is a sectional side elevational view of the embodiment of FIG. 10.

The construction of FIGS. 10–12 is similar to that of the first embodiment but the positions or directions of the nozzles and heat sinks are rotated through 90° from those in the first embodiment.

A plurality of heat-generating semiconductor devices 21 and, hence, the heat sinks 22 attached thereto, are arranged in a matrix-like form in close proximity of one another as in the first embodiment, in such a manner that the fractions or portions of air from the respective heat sinks 22 flow in parallel with one another through the gap between the adjacent heat sinks 22. In this case, however, the nozzles 23 are arranged such that the confluence air flow 28 emitted from the heat sinks 22 flows in the horizontal direction, as shown in FIG. 10. The discharge outlet of the air is provided in an upper portion of the section which is defined by partition walls 29. Each confluence air flow 28 horizontally shunts to the left and right from the central region of the discharge space between the nozzles 23 into left and right spaces defined between the partition walls 29 and the heat sinks 22 adjacent to the partition walls 29 and makes a turn through 90°. Many of such confluence air flows 28 join one after another to form a combined air flow 70 which is directed towards the discharge outlet.

Thus, in contrast to the first and the second embodiments in which the confluence air flow 28 is directed vertically from the lower side to the upper side, the embodiment of FIGS. 10–12 features the confluence air flow 28 shunting horizontally to the left and right from the central region of the substrate. Despite such a change in the construction, the embodiment of FIGS. 10–12 offers the same advantage as that offered by the first embodiment.

Figure 13:
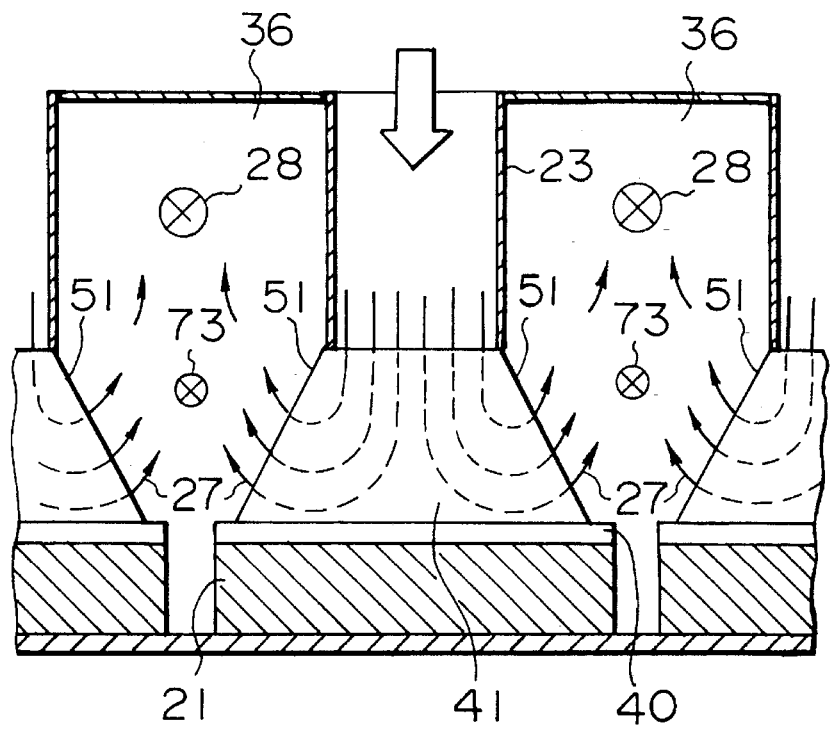
FIG. 13 is an illustration of a modification showing a different form of the heat sink, on an enlarged scale.

In FIG. 13 the breadth of the fins 41 progressively decreases from the base ends adjacent to the heat-generating semiconductor device 20 towards the other end where the nozzles 23 are secured. Thus, in the embodiment of FIG. 13, the breadth of the fins 41 is equal to the breadth of the nozzle 23 at the ends of the fins 41 adjacent to the nozzle 23 but progressively increases linearly towards the base 40. Consequently, the distance between the discharging end surfaces 51 of the adjacent heat sinks 22 progressively increases from the end adjacent to the base 40 towards the end adjacent the nozzle 23, so as to promote the turning of the air 27 through 180° from the interior of the heat sink 22 into the discharge space 36 and to promote also the joining with the air 27 from the adjacent heat sink 22, thus reducing the resistance against the flow of the air from both heat sinks 22 into the common discharge space 36.

In addition, the cross-sectional area of the space defined between the opposing discharge end surfaces of adjacent heat sinks 22 is increased so that the confluence air flow 73 flowing in the space between the opposing discharge end surfaces of adjacent heat sinks form a part of the confluence air flow 28. It is thus possible to reduce the flow resistance encountered by the air to be discharged. The trapezoidal form of the fin 41 can be obtained by removing left and right upper portions from a rectangular form. The heat dissipation area is reduced as a result of removal of such portions. This, however, does not materially affect the cooling performance of the heat sink 22 because the removed portions inherently do not make significant contribution to the heat exchange due to their low temperature.

Figure 14:
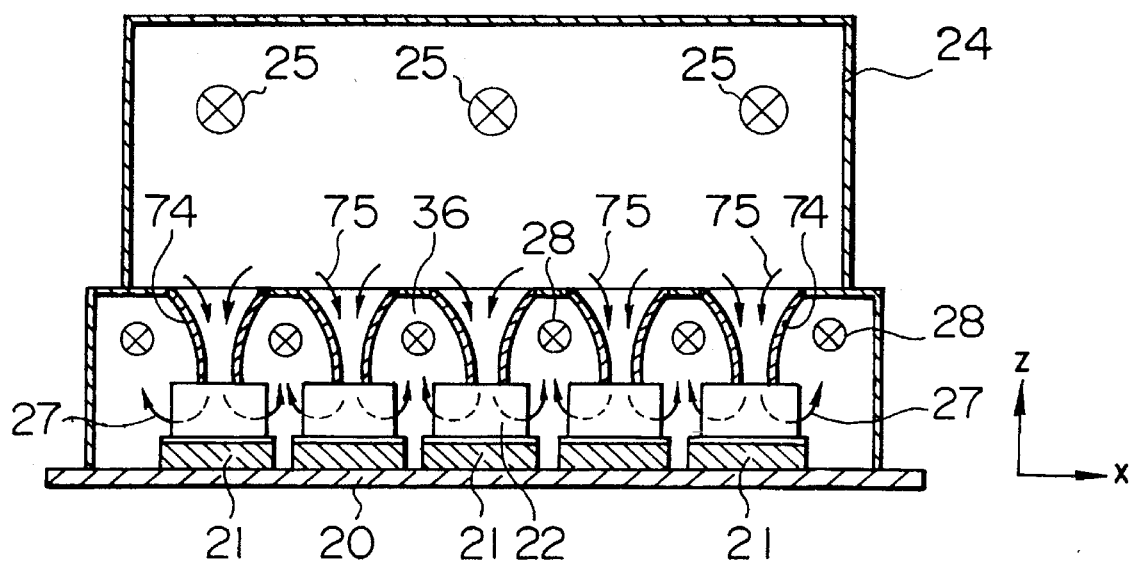
FIG. 14 is a sectional bottom plan view of a different embodiment of the electronic apparatus in accordance with the present invention.

In the embodiment of FIG. 14 the nozzle 74 through which cooling air is supplied into the heat sink 22 has a breadth which is gently and progressively decreased in a curvilinear manner from the upstream end to the downstream end of the nozzle 74, for example, towards the end of the nozzle 74 connected to the heat sink 21. Thus, the nozzle 74 has a restricted downstream end. Consequently, the cooling air supplied by, for example, a blower into the chamber 24 is allowed to smoothly flow into each of the nozzles 74 as indicated by arrows 75. The upstream end of the nozzle 74 smoothly merges in the wall surface of the chamber 24. Therefore, no burble of air takes place at the joint between the nozzle 74 and the wall of the chamber 24 when the air enters the nozzle 74. This remarkably reduces the resistance encountered by the air flowing from the chamber 24 into the nozzles 74. In the embodiment of FIG. 14, the breadth of the nozzle 74, as measured in the x-direction parallel to the fins, progressively decreases to form the restricted downstream end of the nozzle 74. This, however, is only illustrative and the nozzle 74 may be formed such that the width, as measured in the y-direction perpendicular to the fin direction, progressively decreases so as to form a restricted downstream end. It is also possible to design the nozzle 74 such that both the breadth in the x-direction and the width in the y-direction are progressively decreased towards the downstream end, so that a further reduction in the flow resistance can be attained. Additionally, in the embodiment of FIG. 14, the downstream end of the nozzle 74 contacting the heat sink 22 has a y-direction width which is less than that of the heat sink 22.

Figure 15:
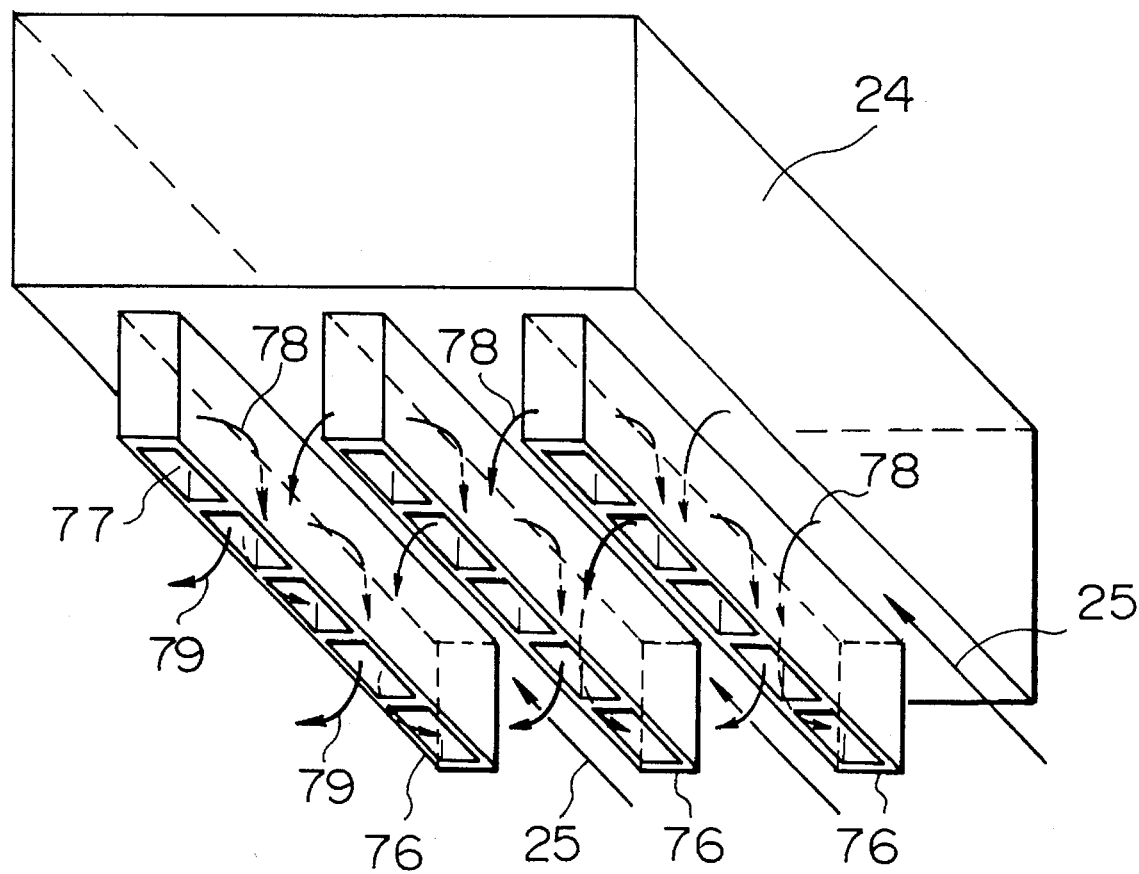
FIG. 15 is an illustration of a different embodiment of the electronic apparatus in accordance with the present invention having a different chamber-nozzle structure.

As shown in FIG. 15, adjacent nozzles are combined into an integral nozzle 76 which has an elongated box-like form, with one side thereof connected to the chamber 24 so as to open in the chamber 24, while the side thereof opposite to the chamber 24 has a plurality of nozzle openings 77 aligned with the heat sinks 22. The air 25 introduced into the chamber 24 flows into the integral nozzle 76 as indicated by arrows 78 and is jetted towards the heat sinks 22 through the nozzle openings 79 as indicated by arrows 79. The arrangement offers an advantage in that no discontinuity is formed in the walls which define the discharge space, because each wall of the integral nozzle is continuous. Consequently, the air is allowed to smoothly flow through the discharge space along these continuous walls encountering smaller flow resistance. This arrangement is advantageous also in that it can reduce the number of parts required for forming the nozzles, thus contributing to a reduction in the production cost.

Figure 16:
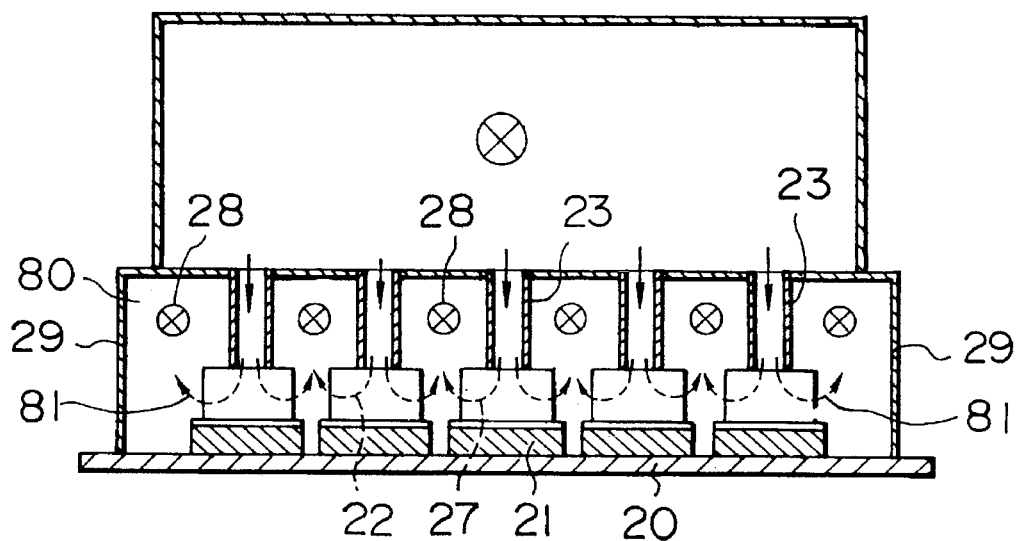
FIG. 16 is a sectional bottom plan view of a different embodiment of the electronic apparatus in accordance with the present invention.
Figure 17:
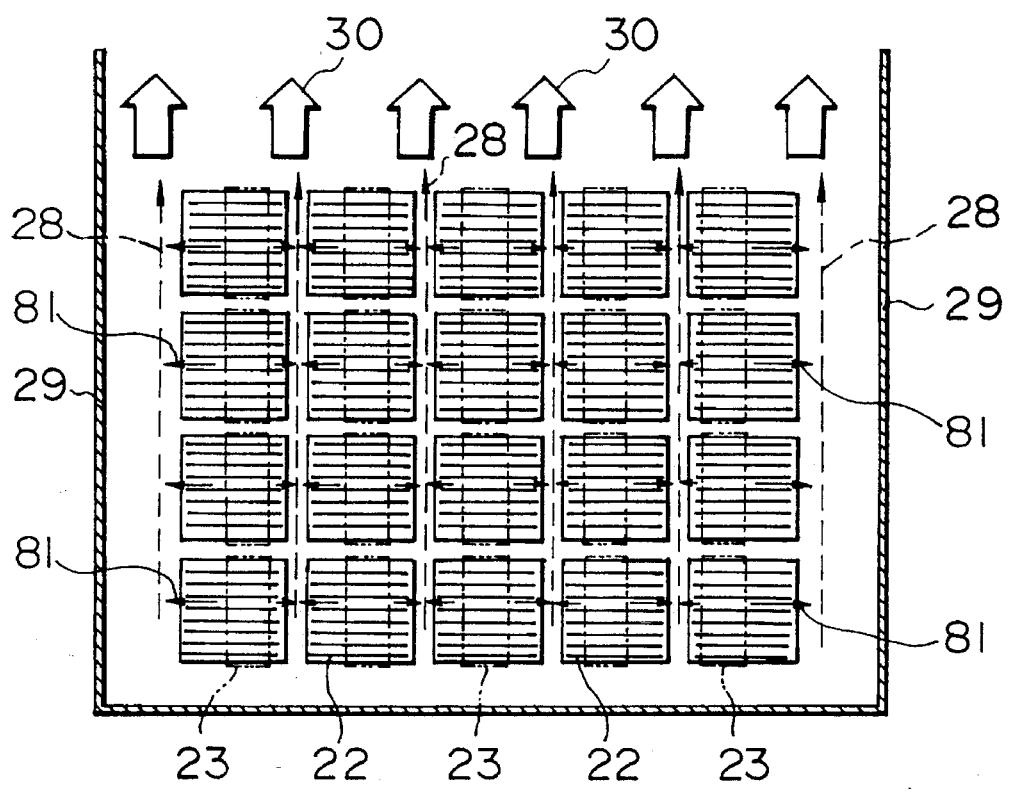
FIG. 17 is a sectional front elevational view of the embodiment of FIG. 16.

FIGS. 16 and 17 illustrate a different embodiment in which the positions and geometry of the nozzles are suitably modified to attain a uniform flow rate distribution over all the heat sinks in the electronic apparatus. Referring first to FIG. 16, the construction of this embodiment is similar to that of the first embodiment shown in FIG. 1, except that positions of some nozzles 23 are shifted horizontally from the positions of the nozzles 23 shown in FIG. 1. In the first embodiment shown in FIG. 1, the cross-sectional area of each outermost discharge space, for example, the space between each outermost heat sink 22 and the adjacent partition wall, has a cross-sectional area greater than those of the discharge spaces defined between adjacent heat sinks 22, so that the air supplied from the chamber 24 tends to flow at a greater rate into the horizontally outermost heat sinks 22 than into the central heat sinks 22, resulting in a non-uniform flow rate distribution in the horizontal direction. This problem is serious particularly when there is no partition wall 29. In order to avoid this problem, as shown in FIGS. 16 and 17, the positions of the nozzles 23 with respect to the associated heat sinks 22 are so varied that the nozzles 23 on outer heat sinks 22 which are closer to the partition wall 29 are offset from the centers of the associated heat sinks 22 away from the partition walls 29, that is, towards the center of the electronic apparatus. The amount of offset is progressively decreased towards the center of the electronic apparatus. In other words, the offset amount is greater on the heat sinks 22 closer to the partition walls 29 than on the heat sinks 22 more remote from the partition walls 29. Consequently, the air 81 in each outermost heat sink 22 closest to the partition wall 29 is required to travel a longer flow path before it is discharged into the discharge space 80 adjacent the partition wall 29 than the flow path to be travelled by the air in central heat sinks before the air reaches the adjacent discharge space. This also applies to the heat sinks 22 which are the second from the outermost heat sinks 22. With this arrangement, it is possible to obtain a uniform flow rate distribution in the horizontal direction over all of the heat sinks.

Figure 18:
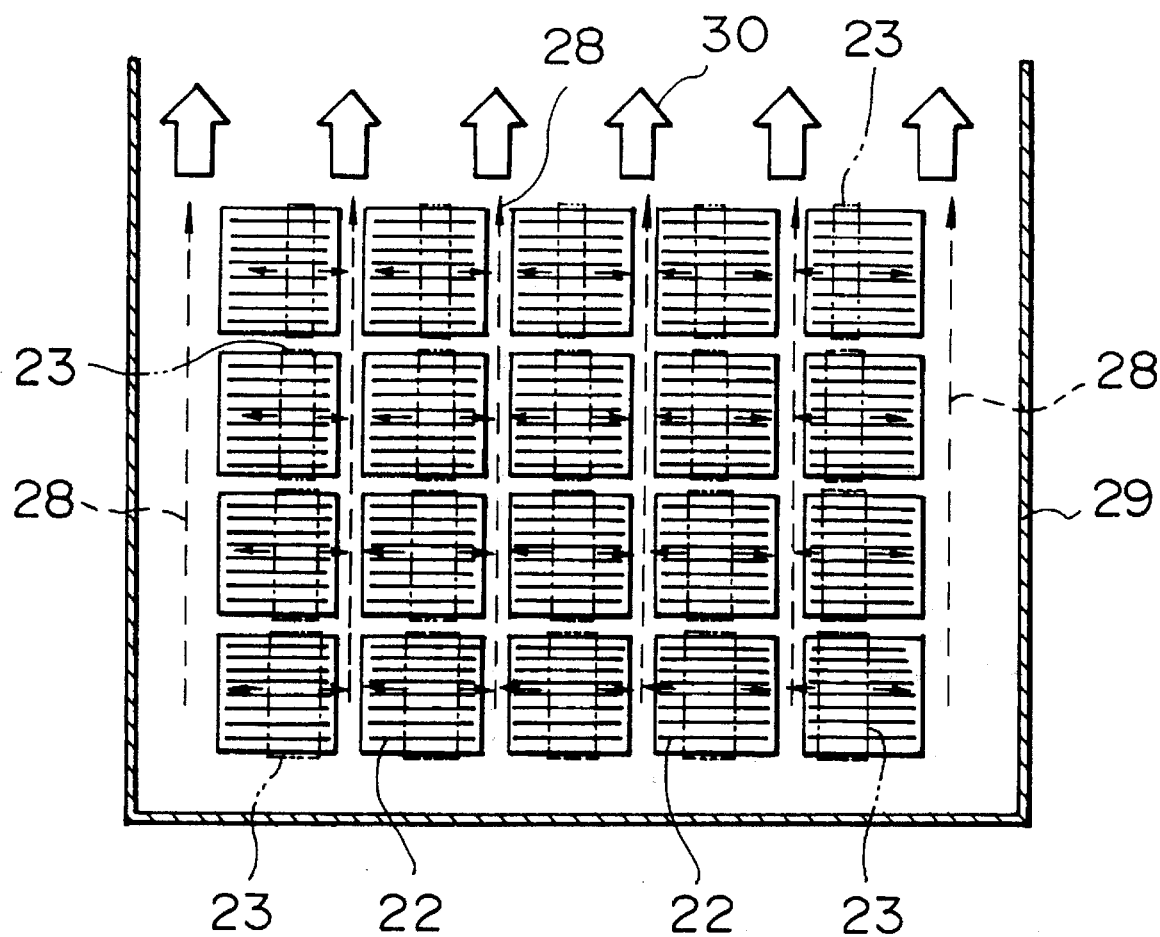
FIG. 18 is a sectional front elevational view of a different embodiment of the electronic apparatus in accordance with the present invention.

The embodiment of FIG. 18 is improved to provide uniform flow rate distribution of the cooling air not only in the horizontal direction but also in the vertical direction. The preceding embodiment described in connection with FIGS. 16 and 17 still encounters the following problem, although it provides uniform flow rate distribution of cooling air in the horizontal direction. Namely, in the embodiment of FIGS. 16 and 17, there is a tendency that the cooling air is concentrated to the heat sinks 22 of downstream rows, i.e., upper rows, rather than to the heat sinks of the upstream rows, i.e., lower rows, as viewed in the direction of the confluence air flow 28, because the air discharged from the heat sinks 22 of the downstream rows encounters a smaller flow resistance than the air discharged from the heat sinks 22 of the upstream rows, due to shorter distance to the discharge outlet. Thus, the rate of supply to the heat sinks 22 of the upper or downstream rows tends to increase, while the rate of supply of the air to the heat sinks 22 of the lower or upstream rows tends to decrease, resulting in a non-uniform flow rate distribution in the vertical direction. Therefore, the embodiment shown in FIG. 18 features, in addition to the features of the embodiment of FIGS. 17 and 18, that the horizontal breadth of the nozzles is progressively decreased towards the upper or downstream end such that the nozzles associated with the heat sinks 22 of the lowermost row has the greatest horizontal breadth. Thus, the nozzles associated with the heat sinks 22 of the upper rows have smaller cross-sectional areas than the nozzles associated with the heat sinks of lower rows, so that air encounters a greater flow resistance in the nozzles associated with the heat sinks 22 of upper rows than in the nozzles associated with the heat sinks of lower rows. By suitably determining the difference in the horizontal nozzle breadth, it is possible to obtain a uniform flow rate distribution of cooling air also in the vertical direction, over all the heat sinks 22 of the electronic apparatus.

The methods of attaining uniform flow rate distribution as explained in connection with FIGS. 17 and 18 can apply not only to the first embodiment but also to a variety of mounting arrangements of nozzles and heat sinks. Obviously, the methods for attaining uniform flow rate distributions in horizontal and vertical directions may be employed independently or in combination.

Although the embodiments described hereinbefore employ heat sinks having tabular fins, this is only illustrative and other types of heat sinks such as those having pin-type heat dissipation members may equally be employed provided that such heat sinks are constructed and arranged to govern the direction of flow and discharge of the air therethrough.

Figure 19:
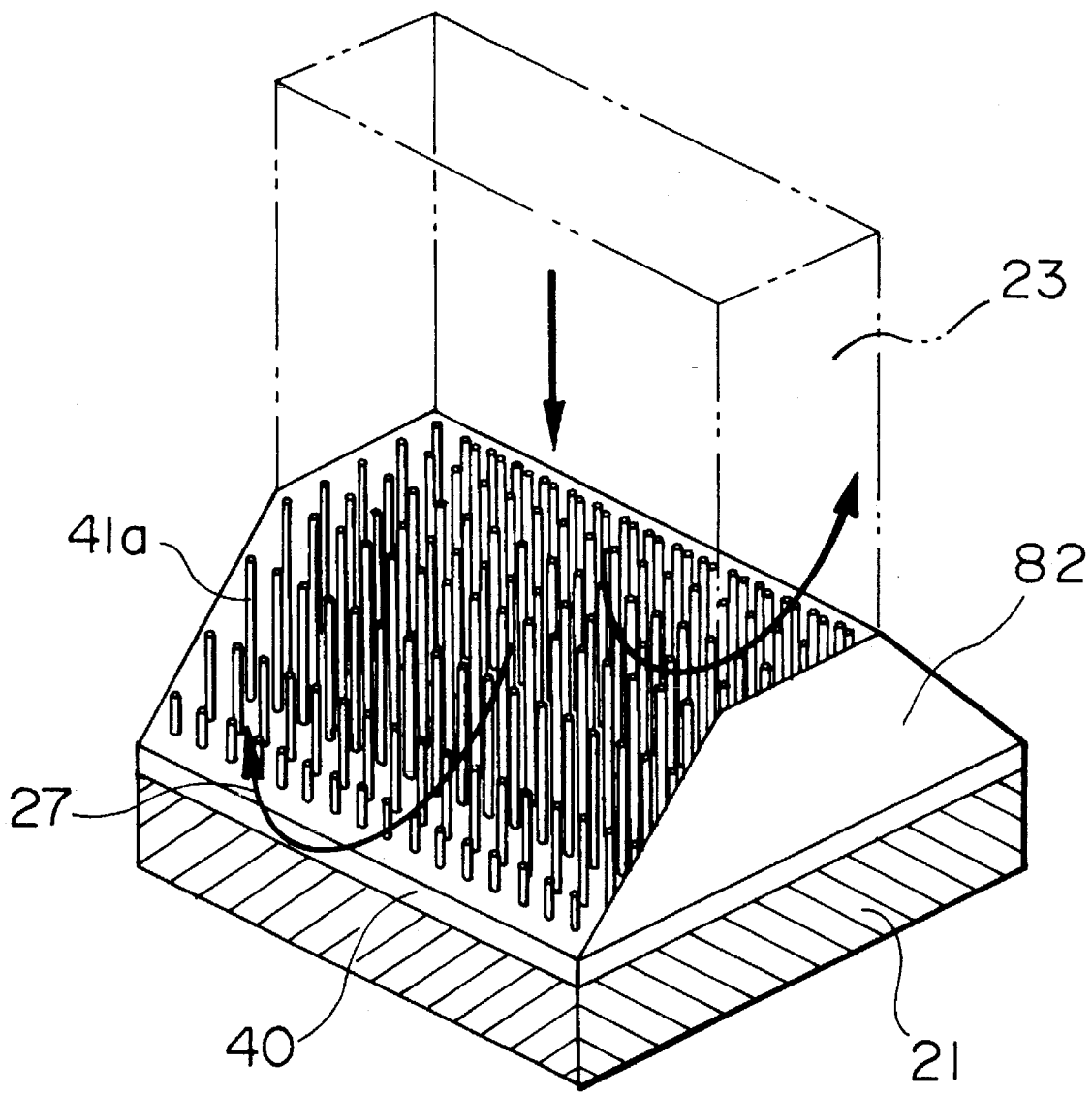
FIG. 19 is a perspective view of a different embodiment of the electronic apparatus in accordance with the present invention, showing a different form of the heat sink.

The embodiment of FIG. 19 employs a plurality of heat-generating semiconductor devices 21 such as LSI modules, on each of which is provided a heat sink which is composed of a base plate 40 and a plurality of heat dissipating fins formed as heat dissipating pins 41a. The pins 41a and the base plate 40 are preferably made of a metal having high heat conductivity such as copper or aluminum, or a heat conducting ceramics. The pins 41a may be fixed to the base plate 40 by caulking or joined by soldering or brazing, as well as by bonding by a heat conductive adhesive. Alternatively, an integral heat sink having the base plate 40 and the pins 41a may be formed by machining such as grinding. A nozzle 23 is disposed on the upper side of the group of the pins 41a. End plates 82, continuing from the walls of the nozzle 23, are provided on both ends of the group of the pins 41a. These end plates 82 determine the direction of flow and discharge of air through the heat sink. The height of the pins 41a is so varied that the pins in the central region of the heat sink have the greatest height but the height is progressively reduced towards both downstream ends as viewed in the direction of flow and discharge of the air through the heat sink, that is, towards both lateral ends of the heat sink. This variation in the pin height enables the cooling air to easily turn 180° into the adjacent discharge space, so that the air from adjacent heat sinks can easily be discharged into the common discharge space between these heat sinks with reduced flow resistance. In addition, the group of heat dissipating pins 41a provides a greater area of heat dissipation than that provided by tabular cooling fins. In addition, the heat dissipating pins 41a produce turbulency of the cooling air which enhances transfer of heat to the cooling air, thus contributing to improvement in the cooling performance.

Figure 20:
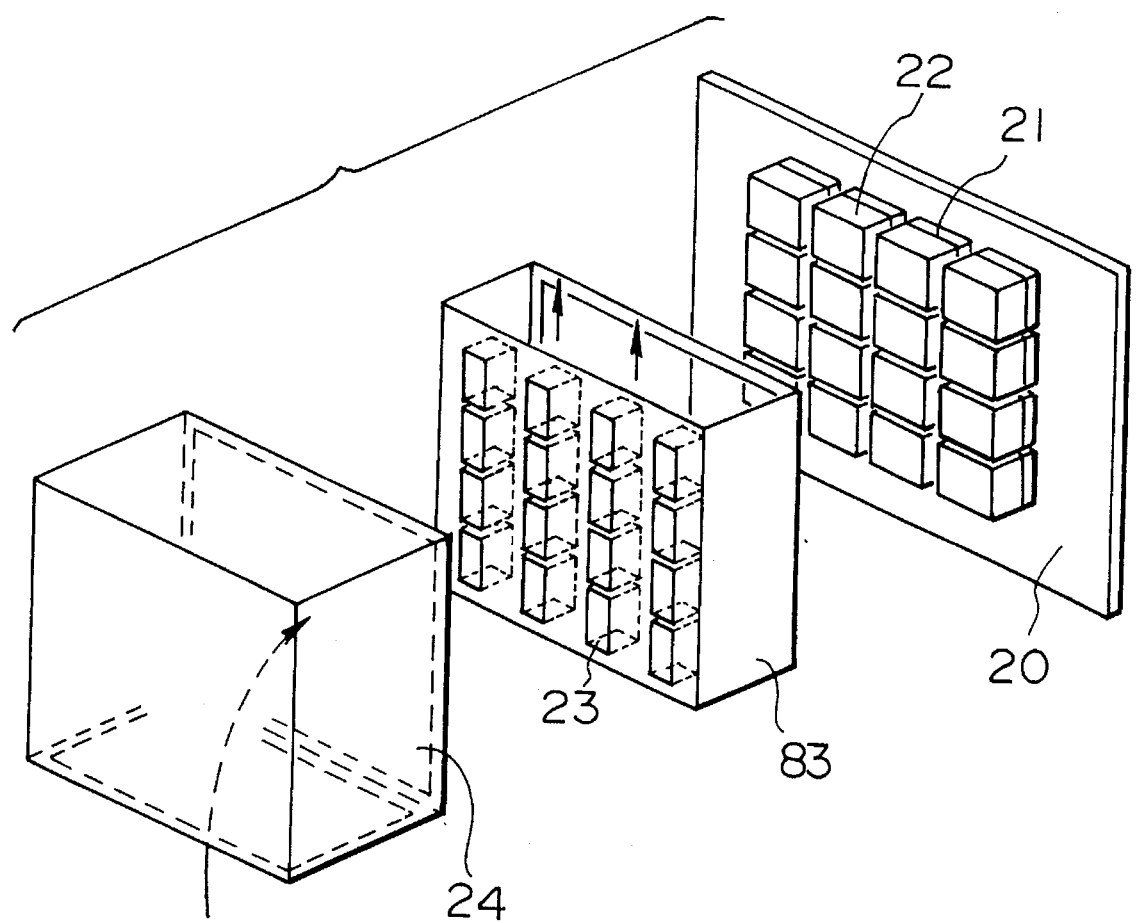
FIG. 20 is an exploded perspective view of a different embodiment of the electronic apparatus in accordance with the present invention, showing the method of constructing a nozzle duct and a chamber.
Figure 21A:
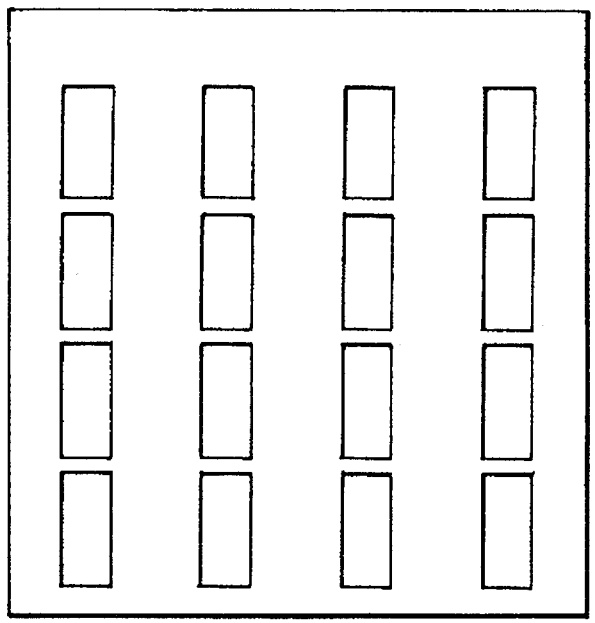
FIGS. 21A–21C are illustrations of a nozzle duct as viewed in three orthogonal directions.
Figure 21C:
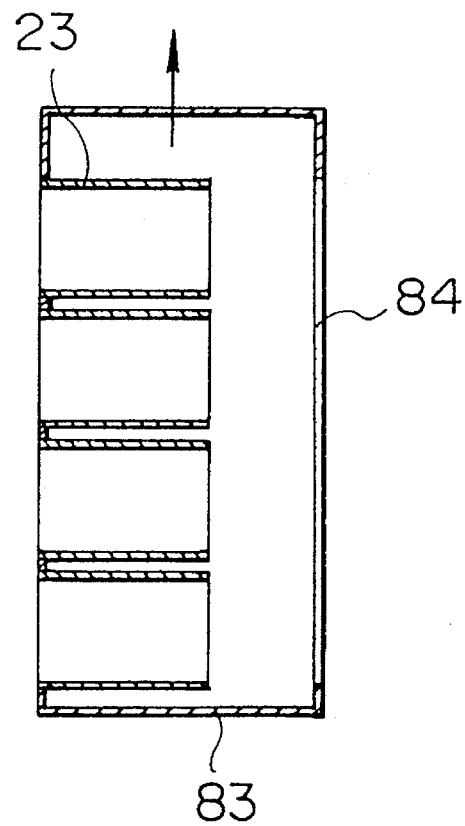
Figure 21B:
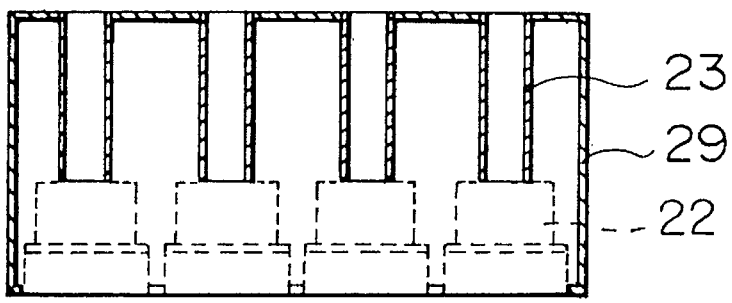

As shown in FIG. 20, a board 20 carries a plurality of heat-generating semiconductor devices 21 such as LSI modules, and heat sinks 22 are provided on respective heat-generating semiconductor devices 21. As shown in FIGS. 21A, 21B and 21C the nozzle 83 has partition walls 29 and nozzles 23 for supplying cooling air into the heat sinks 22. The partition walls 29 serve to guide the heated cooling air from the heat sinks 22 towards a discharge outlet and to isolate components of the electronic apparatus other than the semiconductor devices 21 from the heated cooling air. The nozzle duct 83 has openings in its sides perpendicular to the nozzles 23. An opening 84 is formed in the side of the nozzle duct 83 adjacent the heat sinks 22, so as to enable the heat sinks 22 and the associated LSI modules to be received in the nozzle duct 83. The heat sinks 22 received in the nozzle duct 83 contact corresponding nozzles 23. The wall of the nozzle duct 83 facing the chamber 24 has a plurality of windows through which cooling air is introduced into the respective nozzles. The nozzle duct is joined at this wall to the chamber 24.

The described arrangement of the nozzle duct 83 and the chamber 24 makes it possible to independently fabricate the nozzles and the chamber, and allows easy locating of the nozzles and heat sinks with respect to each other, thus facilitating the time required for the assembly. Protective maintenance and inspection also are facilitated because the nozzles are separable from the chamber.

As will be understood from the foregoing description, the present invention provides an electronic apparatus in which heat sinks associated with heat-generating semiconductor devices are so arranged that the directions of flow and discharge of air through these heat sinks are parallel to one another, and nozzles for supplying a cooling medium into the heat sinks are provided on the ends of the heat sinks opposite to the associated heat-generating semiconductor devices. In addition, the width of the nozzle, as measured in the direction perpendicular to the direction of flow and discharge of the air through the heat sink, is to be greater than that of the heat sink, while the breadth of the nozzle as measured in the direction parallel to the direction of flow and discharge of the air in the heat sink, is less than that of the heat sink. In addition, confluence air flow of heated cooling air formed by cooling air fractions emitted from a plurality of heat sinks is made to flow along the end surfaces of these heat sinks opposite to the associated heat-generating semiconductor devices and along the nozzle wall surfaces perpendicular to the direction of flow and discharge of air in the heat sinks. Thus, in the electronic apparatus in accordance with the first aspect of the present invention, the direction of the confluence air flow to be discharged is substantially orthogonal to the direction of air flow and air discharge through the heat sinks. It is therefore possible to reduce flow resistance along the path through which the heated air is discharged, even when a large number of heat-generating semiconductor devices are densely arranged on a plane to such a degree that makes it difficult to find ample air discharge spaces between adjacent heat sinks or between the heat-generating semiconductor devices, whereby the cooling performance is improved. In addition, noise can also be reduced by virtue of repeated flexing of the path of the cooling air. Furthermore, a uniform flow rate distribution and, hence, uniform temperature distribution, can be attained over all the heat-generating semiconductor elements in the electronic apparatus.

Figure 22:
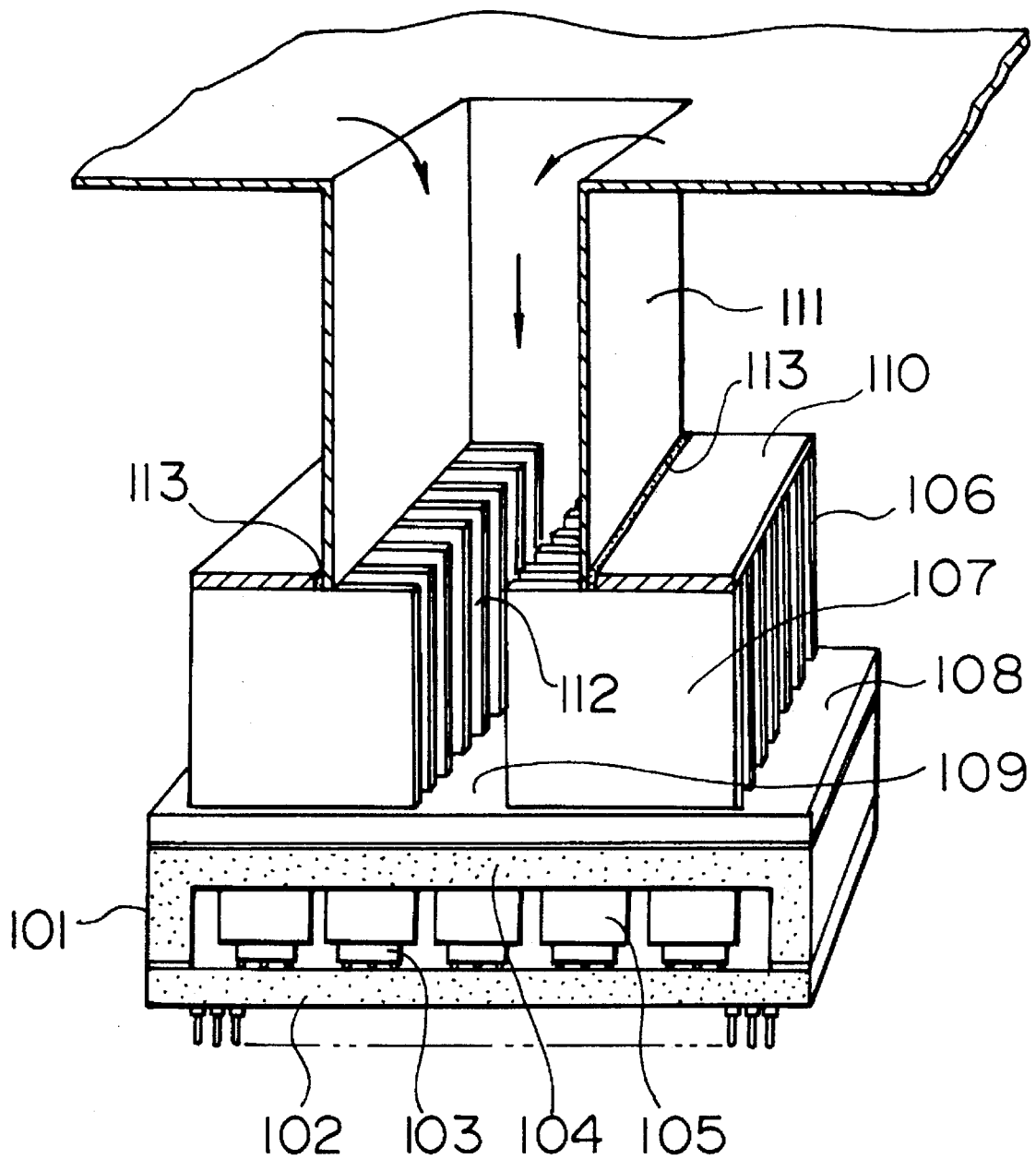
FIG. 22 is a partly-sectioned perspective view of an embodiment of a cooling apparatus in accordance with the present invention.
Figure 23:
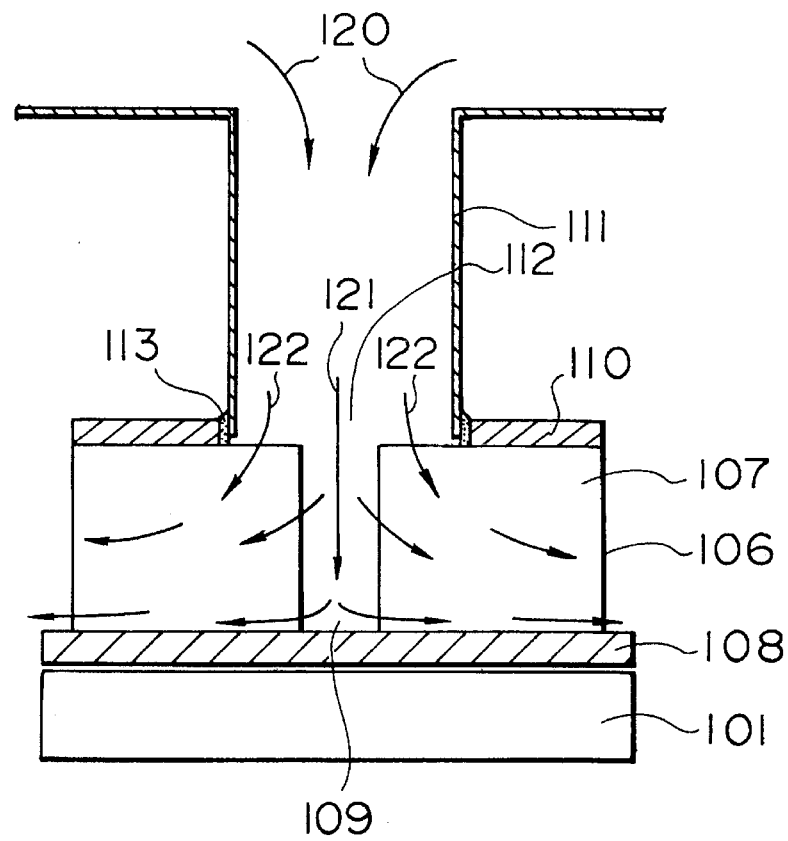
FIG. 23 is a cross-sectional view of the embodiment of FIG. 22 illustrating a portion of the embodiment.

In FIGS. 22 and 23, a heat-generating unit produces heat during its operation and is to be cooled by a cooling apparatus of the present invention, with the heat-generating unit being exemplified by a multi-chip module including a plurality of semiconductor devices airtightly sealed together in the module and capable of producing heat at a high density during operation.

Referring to FIGS. 22 and 23, a multi-chip module 101 comprises a multi-layer wiring board 102 made of a ceramic material, a plurality of semiconductor devices 103 mounted on the wiring board 102 and containing LSI chips serving as heat-generating members, and a housing 104 in which the semiconductor devices 103 are sealed. Heat generated by the semiconductor devices 103 is transferred to the housing 104 through heat transfer contacts 105 contacting the semiconductor devices 103. A heat sink 106 is mounted on the housing 104 so that heat transferred to the housing 104 can be effectively transferred to a cooling fluid such as cooling air. The heat sink 106 is made of a material with a high thermal conductivity, such as aluminum, copper or a high thermal-conductivity ceramic material, and includes a multiplicity of flat-plate shaped fins 107 arranged at a certain interval on a fin base 108. The heat sink 106 has a slit 109 formed in a central portion of the heat sink 106 by slitting the flat-plate shaped fins 107 to a certain depth, that is, from a surface of the heat sink 106 facing a cooling fluid ejection nozzle 111 (an upper surface of the heat sink 106, as viewed in FIGS. 22 and 23) to a lower position at the root of the fins 107, the slit 109 extending through the arrangement of the flat-plate shaped fins 107. The slit 109 has a width greater than the interval at which the flat-plate shaped fins 107 are arranged. The nozzle 111 is disposed on the upper surface of the heat sink 106 for introducing air flow from a blower or the like (not shown) into the heat sink 106. The nozzle 111 has an open forward-end portion inserted in a cooling air inlet 112 formed in a heat sink retaining plate 110 of the heat sink 106.

A buffer comprising buffer members 113 and made of a soft material is disposed at either the forward end portion of the nozzle 111 or the cooling air inlet 112 of the heat sink 106. The multi-chip module 101 and the heat sink 106 thermally contact each other through a thermally conductive structure such as a thermally conductive grease, a thermally conductive sheet, a thermally conductive adhesive or fastening bolts. The heat sink retaining plate 110 is adhered, or otherwise joined, to upper edge portions of the plurality of flat-plate shaped fins 107.

In the embodiment of FIGS. 22 and 23, air flows through the nozzle 111, as indicated by arrows 120 in FIG. 23, and ejected by the nozzle 111 in such a manner so as to be introduced into the spaces between the fins 107 as well as into the slit 109. Since the slit 109 has a width greater than the interval of the arrangement of the fins 107, air flowing depthwise in the slit 109, as indicated by arrows 121 in FIG. 23, has a relatively small flow loss of the fluid, and also has a greater flow velocity than air flowing in the spaces between the fins 107, as indicated by arrows 122. As a result, a portion of cooling air 121 flowing in the slit 109 directly reaches the root of the fins 107 and the fin base 108 at a location of the heat sink 106 which is above a central portion of the multi-chip module 101 acting as the heat-generating unit, with substantially no decrease in the flow velocity of the cooling air portion 121. In addition, since the cooling air portion 121 flowing in the slit 109 does not pass through the spaces between the fins 107, the cooling air portion 121 directly reaches the fin-root location of the heat sink 106 which is above a central portion of the multi-chip module 101, with substantially no increase in the temperature of the cooling fluid. It is therefore possible for the apparatus to provide an improved cooling performance for a central portion of the multi-chip module 101 where great temperature increases generally occur. Hence, efficient cooling of a heat-generating unit with uniform temperature distribution in the unit is possible. Even when cooling a multi-chip module including a plurality of semiconductor devices, the module can be efficiently cooled while achieving uniform distribution of temperature between the semiconductor devices which generates heat at a high density.

The width of the slit 109, which is greater than the interval of arrangement of the fins 107, may be increased with a view toward increasing the flow velocity of cooling air flowing depthwise in the slit 109. However, an excessively great width of the slit 109 reduces the area of the flat-plate shaped fins 107, resulting in reduced cooling performance of the heat sink 106 with respect to a central portion of the multi-chip module 101. Thus, the width of the slit 109 has an optimal value.

Figure 24:
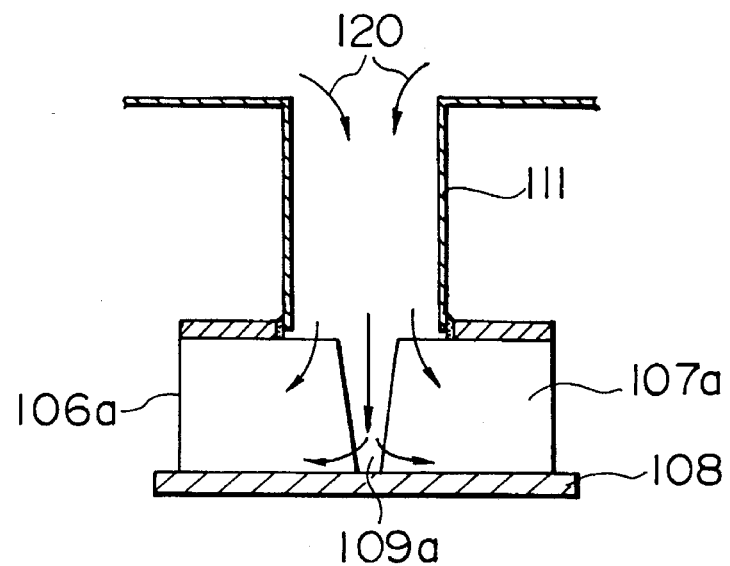
FIG. 24 is a cross-sectional view of a modification of the embodiment of FIG. 22.

As shown in FIG. 24, a slit 109a is formed in a central portion of a heat sink 106a. The width of the slit 109a is relatively great at the cooling air inlet on the heat sink 106a and gradually decreases toward the root of a plurality of flat-plate fins 107a. This arrangement makes it possible to decrease the pressure loss of cooling air which flowed into the slit 109a, and to increase the flow rate of cooling air flowing through the slit 109. As a result, it is possible to further improve cooling performance with respect to a central portion of the relevant multi-chip module (not shown) where great temperature increases are likely to occur, and to more efficiently cool semiconductor devices in the multi-chip module.

Figure 25:
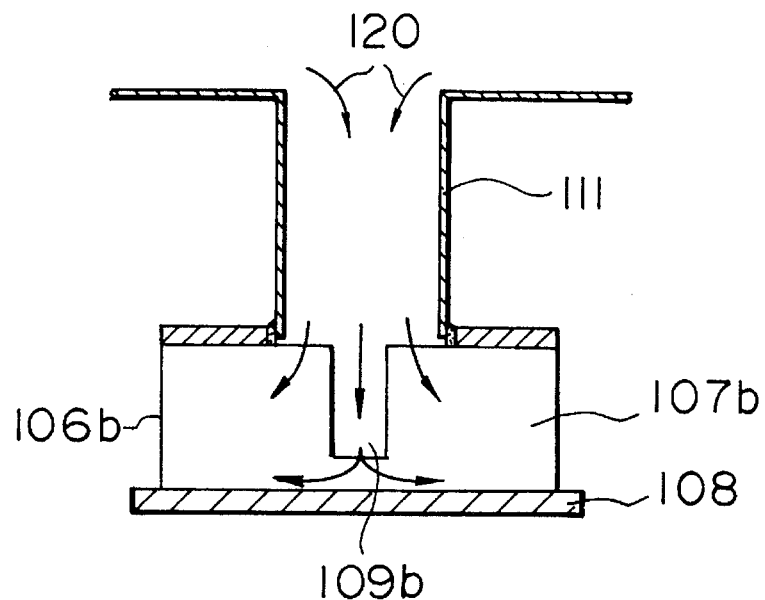
FIG. 25 is a cross-sectional view of another modification of the embodiment of FIG. 22.

As shown in FIG. 25, a slit 109b is formed in a central portion of a heat sink 106b by slitting a plurality of flat-plate shaped fins 107b. The fins 107b are slit from an upper surface of the heat sink 106b, but are not slit to the root of the fins 107b, so that portions of the fins 107b remain below the bottom of the slit 109b. This arrangement makes it possible to prevent an increase in the width of the slit 109b from causing a reduction in cooling performance with respect to a central portion of the relevant multi-chip module.

In each of the foregoing embodiments, the cooling fluid ejection nozzle 111 has a width smaller than the width of heat sink 106, 106a or 106b. However, this is a mere example, and the width of the nozzle 111 may be the same as that of the associated heat sink.

Figure 26:
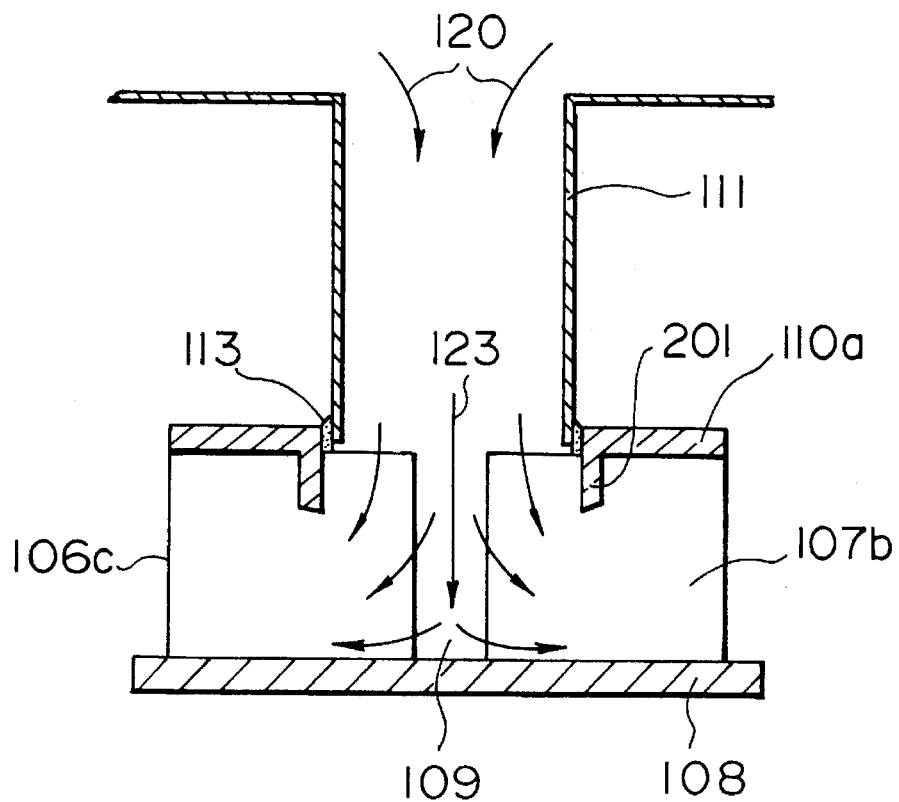
FIG. 26 is a cross-sectional view of still further modification of the embodiment of FIG. 22.

As shown in FIG. 26, a heat sink retaining plate 110a is disposed on an upper surface of a heat sink 106c and has an L-shaped sectional configuration. Specifically, the heat sink retaining plate 110a includes central portions each bent in an L-shaped sectional configuration and each disposed in a space between flat-plate shaped fins 107, so that these edge portions serve as elements of a flow guide 201 for causing a cooling fluid ejected through an upper surface of the heat sink 106c to flow at a high speed toward a central portion of the interior of the heat sink 106c. Thus, the flow guide 201 serves to create relatively strong cooling-fluid flow, indicated by the arrows 123, in a slit 109 formed in a central portion of the heat sink 106c, which flow directly reaches a fin-root location of the heat sink 106c above a central portion of the relevant multi-chip module. In this way, a central portion of a multi-chip module where great increases in temperature are likely to occur, can be cooled with increased cooling performance, and semiconductor devices in the module can be efficiently cooled.

Figure 27:
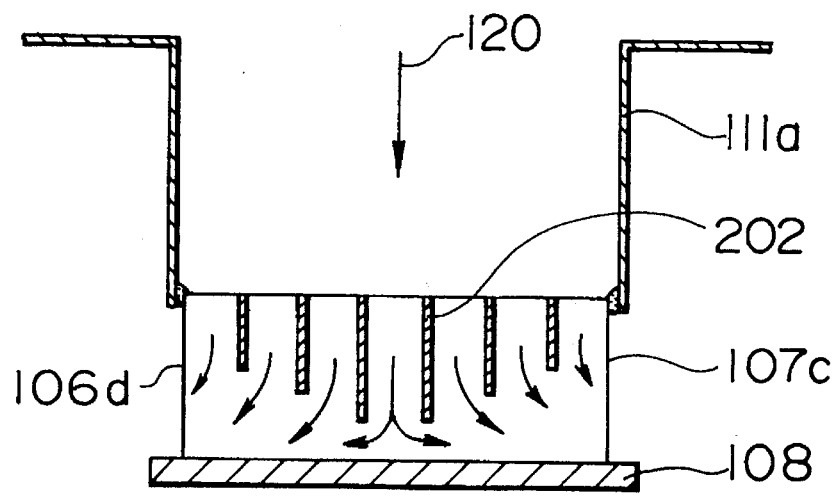
FIG. 27 is a cross-sectional view of another embodiment of the cooling apparatus in accordance with the present invention.

The embodiment of FIG. 27 has a heat sink 106d, a plurality of flat-plate shaped fins 107c, and a flow guide 202. The flow guide 202 includes a set of guide elements provided in a space between flat-plate shaped fins 107c for controlling flow of a cooling fluid, the elements of the flow guide 202 extending from an upper surface of the heat sink 106d toward the root of the fins 107c. The length of the elements of the flow guide 202 is less than the height of the flat-plate shaped fins 107c, and varies in such a manner as to gradually decrease from a central location of the heat sink 106d toward side locations thereof.

In the embodiment of FIG. 27, cooling fluid ejected into the heat sink 106d through the upper surface thereof flows along the elements of the flow guide 202 into the spaces between the flat-plate shaped fins 107c. Since the flow guide 202 has the greatest length at a central location of the heat sink 106d, it is possible to make the flow of the cooling fluid reach to the root of the relevant fins 107c even at the center of the heat sink 106d. Since the length of the flow guide 202 gradually decreases from a central location toward side locations, a portion of cooling-fluid flow leaving those flow guide elements at central positions is forced by another portion of cooling-fluid flow from adjacent flow guide elements to flow toward a fin root location, thereby causing an increased flow velocity at such a location. As a result, it is possible to improve cooling performance at fin root locations where temperature is likely to be highest, and also to improve cooling performance with respect to a central portion of the relevant heat-generating unit where great temperature increases are likely to occur.

Figure 28:
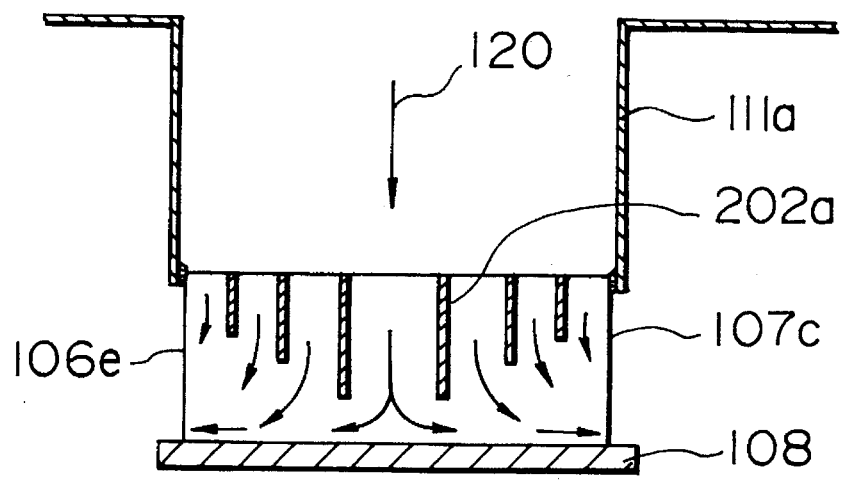
FIG. 28 is a cross-sectional view of a modification of the embodiment of FIG. 27.

As shown in FIG. 28, a flow guide 202a has guide elements which are arranged at a pitch decreasing from a central location of a heat sink 106e toward side locations thereof. Specifically, those flow guide elements at central positions of the heat sink 106e have the greatest interval so that it is possible to convert flow of a cooling fluid into flow at a higher speed.

Figure 29:
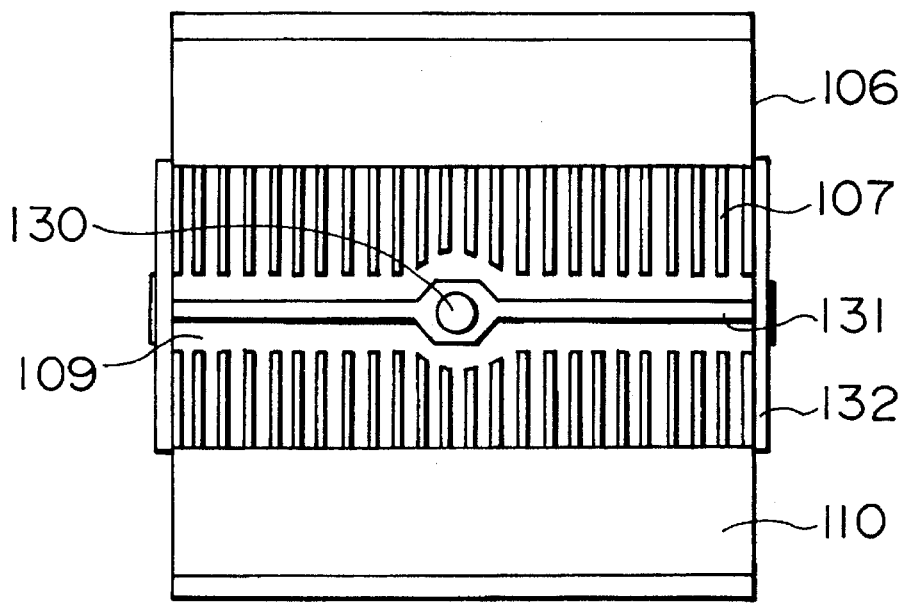
FIG. 29 is a plan view of a different embodiment of the cooling apparatus in accordance with the present invention.
Figure 30:
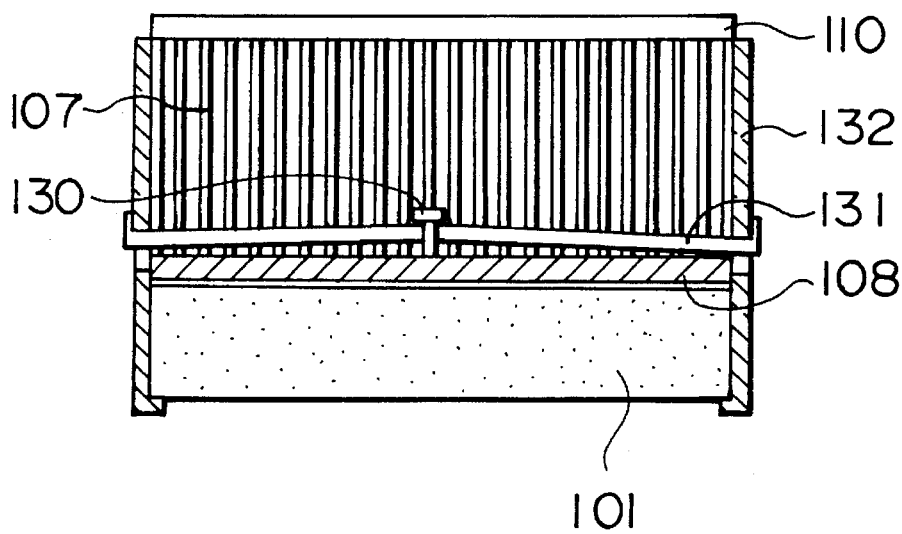
FIG. 30 is a sectional side elevational view of the embodiment of FIG. 29.
Figure 31:
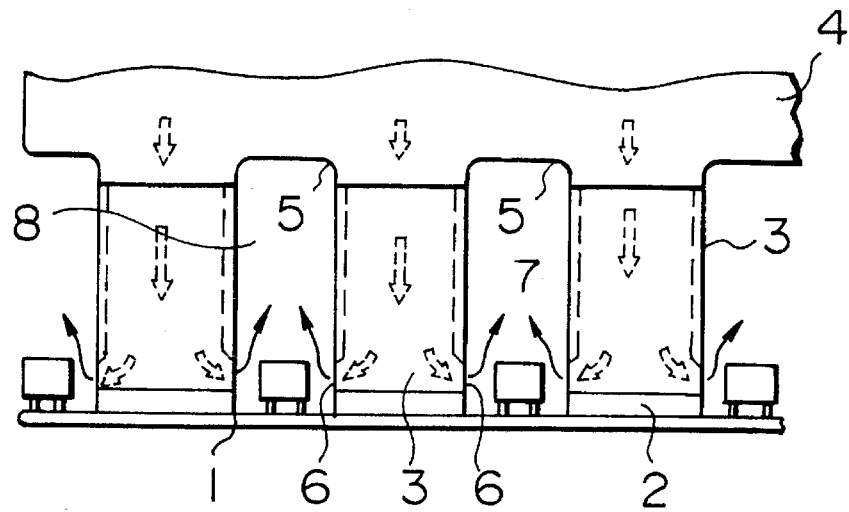
FIG. 31 is a sectional bottom plan view of a conventional electronic apparatus.
Figure 32:
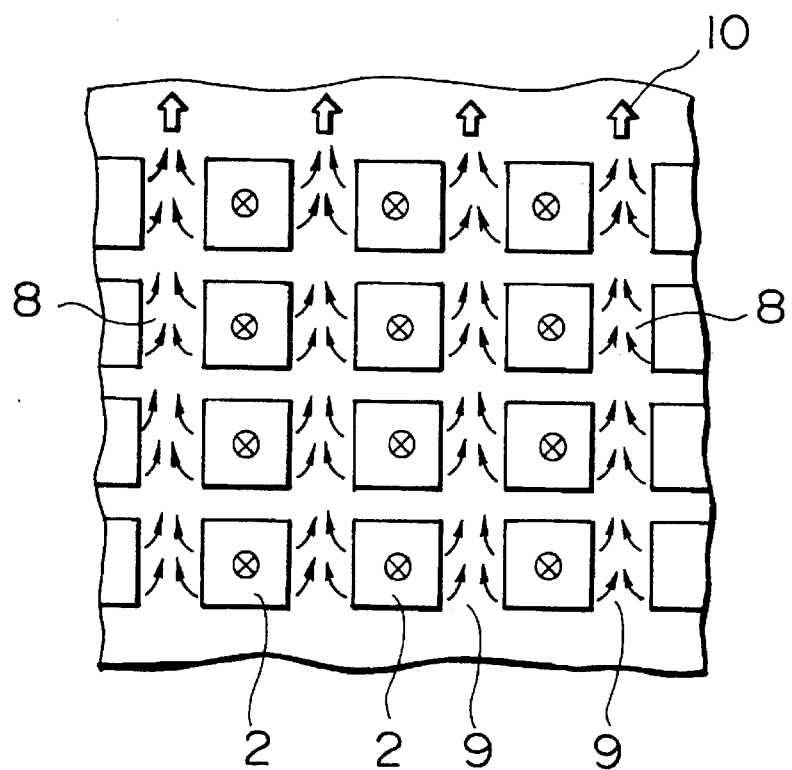
FIG. 32 is a sectional front elevational view of a critical portion of the conventional electronic apparatus shown in FIG. 31.
Figure 33A:
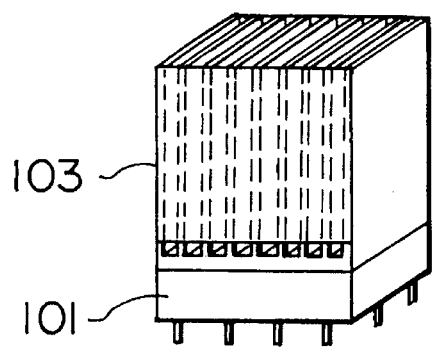
FIGS. 33A and 33B are a perspective view and a sectional view of a portion of a known cooling apparatus.
Figure 33B:
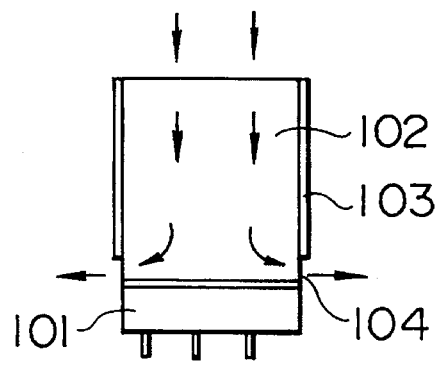
Figure 34A:
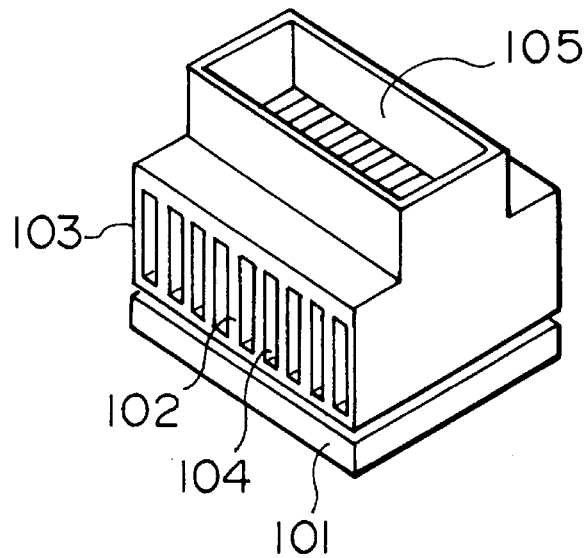
FIGS. 34A and 34B are a perspective view and a sectional view of another known cooling apparatus.
Figure 34B:
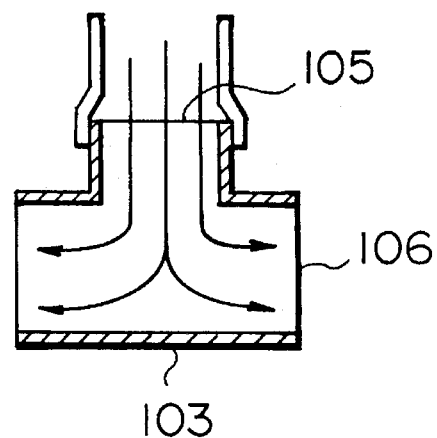

In the embodiment of FIGS. 29 and 30, a plate spring 131 and a clamp 132 are provided with the plate spring 131 being disposed in a slit 109 formed in a central portion of a heat sink 106 and extending through an arrangement of a plurality of flat-plate shaped fins 107, and having a clamping force that can be adjusted by a bolt 130. The clamp 132 has an L-shaped cross-sectional configuration, as shown in FIG. 30, and comprises a pair of clamp members 132 supported by the bottom plate of the relevant heat-generating unit, e.g., a multi-chip module 101, and disposed on a pair of opposed side surfaces of the heat sink 106 which are at either end of the arrangement of the flat-plate shaped fins 107. The plate spring 131 is assembled on the heat sink 106, and the resultant assembly is mounted on the multi-chip module 101. The L-shaped clamp 132 closes openings of the slit 109 which are on the opposed side surfaces, thereby reducing leakage of a cooling fluid through the slit 109.

From the viewpoint of assembly of the multi-chip module 101, it is preferable that the heat sink 106 and the multi-chip module 101 be prepared as separate units. Therefore, the multi-chip module 101 and the heat sink 106 are thermally in contact with each other through, for example, a thermally conductive grease, a thermally conductive sheet, a thermally conductive adhesive, or fastening bolts. However, since the multi-chip module 101 and the heat sink 106 will have different temperature distributions, and hence, different amounts of thermal deformation when this is caused by temperature distribution, the heat sink 106 is required to follow the thermal deformation of the multi-chip module 101 in order to prevent variations in thermal resistance between the multi-chip module 101 and the heat sink 106. The clamp device featured in the embodiment of FIG. 30 has the combination of the plate spring 131 and the L-shaped clamp 132, with the latter being supported by the bottom surface of the multi-chip module 101. The combination is adapted to apply load to the substantial center of the heat sink 106, and to allow load adjustment by the bolt 130, thereby enabling the heat sink 106 to constantly follow thermal deformation of the multi-chip module 101. Thus, it is possible to stabilize thermal resistance of the multi-chip module and the heat sink 106, as well as to improve space efficiency and to prevent cooling-fluid leakage.

In accordance with the present invention, a slit is formed in a central portion of a heat sink for cooling a heat-generating unit by slitting each of a plurality of fins from an upper surface of the heat sink to a lower position at or in the vicinity of the fin root, thereby making it possible for a cooling fluid flowing depthwise in the slit to directly reach a fin root location above a central portion of the heat-generating unit without decreasing the speed of the cooling fluid. Moreover, the cooling fluid flowing in the slit is able to directly reach the fin root location with substantially no increase in the temperature of the cooling fluid. This makes it possible to increase cooling performance with respect to a central portion of the heat-generating unit. Thus, it is possible to cool a heat-generating unit, such as a semiconductor device integrated circuit LSI structure, with good efficiency and with uniform distribution of temperature in the heat-generating unit. Particularly in the case of a multi-chip module in which LSI chips or the like are mounted at a high density and which have recently come into use in order to enable high-speed processing by a computer, the large number of LSI chips, etc. within the multi-chip module can be uniformly cooled by a common cooling fluid such as air, and thus, without using any special cooling fluid such as water.

The present invention may include a flow guide comprising at least one set of guide elements disposed in the heat sink for guiding an ejected cooling fluid flowing from the upper surface of the heat sink in such a manner that the cooling fluid flows at a high speed toward a central location of the heat sink. With this arrangement, it is possible to intensively cool the vicinity of the fin root at a location above a central portion of the heat-generating unit. If the flow guide is provided in a certain manner in correspondence with the distribution of amounts of heat generation, it is possible to provide a more uniform temperature distribution in the heat-generating unit, which generates heat at a high density, while effecting more efficient cooling.

The present invention may also include a clamp device comprising the combination of a plate spring disposed in a slit of the heat sink and an L-shaped clamp supported by the bottom surface of a heat-generating unit, such as a multi-chip module. When the heat sink, with the clamp device assembled thereon, is mounted on the heat-generating unit, it is possible to mount the heat sink on the heat-generating unit with good reliability and good space efficiency while maintaining a high level of cooling performance of the heat sink with the slit formed therein. The risk of cooling fluid leaking through the slit is reduced by the L-shaped clamp.

Furthermore, according to the present invention, the nozzle end is inserted into a nozzle connecting opening formed in the upper end of the heat sink, through the intermediary of a soft buffer member. It is therefore possible to connect the nozzle to the high-performance heat sink without mechanically burdening the electrical circuit connection to the heat-generating unit, while diminishing leakage of the cooling fluid.

What is claimed is:

1. An electronic apparatus, comprising:

a plurality of heat-generating semiconductor devices mounted on a board;

a plurality of heat sinks attached to corresponding heat-generating semiconductor devices in a heat conducting relationship thereto, said heat sinks being arranged to determine a direction of flow and discharge of a cooling medium therethrough; and a discharge chamber for passage of confluence flow of said cooling medium composed of fractions of heated cooling medium emitted from said heat sinks;

wherein said heat sinks are disposed such that the direction of flow and discharge of said cooling medium through said heat sinks are substantially the same, each of said heat sinks being respectively supplied with said fractions of the cooling medium through a nozzle provided on an end surface of the respective heat sinks opposite to a heat-generating semiconductor device associated with each of the heat sinks and wherein a flow space for the heated cooling medium to be discharged is formed between adjacent nozzles so as to extend in a direction substantially orthogonal to said direction of flow and discharge of said cooling medium in the respective heat sinks, along the end surface of the respective heat sinks opposite to said board.

2. An electronic apparatus, comprising:

a plurality of heat-generating semiconductor devices mounted on a board;

a plurality of heat sinks attached to corresponding heat-generating semiconductor devices in a heat conducting relationship thereto, said heat sinks being arranged to determine a direction of flow and discharge of a cooling medium therethrough; and a discharge chamber for passage of confluence flow of said cooling medium composed of fractions of heated cooling medium emitted from said heat sinks;

wherein said heat sinks are disposed such that directions of flow and discharge of said cooling medium through said heat sinks are substantially the same, each of said heat sinks being respectively supplied with said fractions of the cooling medium through a nozzle provided on an end surface of the respective heat sinks opposite to a heat-generating semiconductor device, and wherein a breadth of each nozzle, as measured in said direction of flow and discharge of said cooling medium through said heat sinks, is less than a breadth of the heat sink associated with the respective nozzles.

3. An electronic apparatus comprising:

a plurality of heat-generating semiconductor devices mounted on a board;

a plurality of heat sinks attached to corresponding heat-generating semiconductor devices in a heat conducting relationship thereto, said heat sinks being arranged to determine a direction of flow and discharge of a cooling medium therethrough; and a discharge chamber for passage of confluence flow of said cooling medium composed of fractions of heated cooling medium emitted from said heat sinks;

wherein said heat sinks are disposed such that directions of flow and discharge of said cooling medium through said heat sinks are substantially the same, each of said heat sinks being respectively supplied with said fractions of the cooling medium through a nozzle provided on an end surface of the respective heat sinks opposite to a heat-generating semiconductor device, and wherein each nozzle has a substantially rectangular cross-section when taken along a plane parallel to said board, with shorter sides of the rectangle of each nozzle extending in said direction of flow and discharge of said cooling medium through the respective heat sinks.

4. An electronic apparatus according to one of claims 1 or 2, wherein a spacing between adjacent nozzles is greater in said direction of flow and discharge of the respective cooling medium through the respective heat sinks than in the direction perpendicular to said direction of flow and discharge of the respective cooling medium through the respective heat sinks.

5. An electronic apparatus according to one of claims 1 or 2, further comprising a partition wall surrounding said heat-generating semiconductor devices, said partition wall having an opening.

6. An electronic apparatus according to one of claims 1 or 2, wherein a distance between two adjacent nozzles in said direction of flow and discharge of said cooling medium through the respective heat sinks is greater than a distance between heat sinks associated with said adjacent nozzles.

7. An electronic apparatus, comprising:

a plurality of heat-generating semiconductor devices mounted on a board;

a plurality of heat sinks attached to respective heat-generating semiconductor devices in a heat conducting relationship thereto, each of said heat sinks being arranged to determine a direction of flow and discharge of a cooling medium therethrough; and a discharge chamber for passage of confluence flow of said cooling medium composed of fractions of heated cooling medium emitted from the respective heat sinks;

wherein said heat sinks are disposed such that the direction of flow and discharge of said cooling medium through said heat sinks are substantially the same, each of said heat sinks being respectively supplied with said fractions of the cooling medium through a nozzle provided on an end surface of the respective heat sinks opposite to a respective heat-generating semiconductor device, and wherein a width of each said nozzle, as measured in a direction perpendicular to said direction of flow and discharge of said cooling medium through said heat sink, is greater than a width of the heat sink associated with the nozzle.

8. A heat sink assembly comprising:

a heat sink receiving heat from a heat-generating semiconductor device and dissipating heat through a heat exchange between the heat sink and a cooling medium, said heat sink assembly determining a direction of flow and discharge of said cooling medium therethrough; and a nozzle provided on one end of said heat sink opposite to said heat-generating semiconductor device, a width of said nozzle, as measured in the direction perpendicular to the direction of flow and discharge of said cooling medium determined by said heat sink, is greater than a width of said heat sink and a breadth of said nozzle, as measured in said direction of flow and discharge of said cooling medium determined by said heat sink, is less than a breadth of said heat sink.

9. A computer comprising:

an electronic apparatus including a plurality of heat-generating semiconductor devices mounted on a board, a plurality of heat sinks respectively attached to corresponding heat-generating semiconductor devices in a heat conducting relationship thereto, said heat sinks being arranged to determine a direction of flow and discharge of a cooling medium therethrough; and a discharge chamber for passage of confluence flow of said cooling medium composed of fractions of heated cooling medium emitted from the respective heat sinks, wherein said heat sinks are disposed such that the direction of flow and discharge of said cooling medium through said heat sinks are substantially the same, each of said heat sinks being respectively supplied with said fractions of the cooling medium through a nozzle provided on an end surface of the respective heat sinks opposite to a heat-generating semiconductor device associated with each of the heat sinks, and wherein a flow space for the heated cooling medium to be discharged is formed between adjacent nozzles so as to extend in a direction substantially orthogonal to said direction of flow and discharge of said cooling medium in the respective heat sinks, along the end surface of the respective heat sinks opposite to said board;

cooling medium supplying means for supplying said cooling medium to said heat sinks;

a chamber for guiding said cooling medium from said cooling medium supplying means to the respective heat sinks; and a housing for housing said electronic apparatus and said cooling medium supplying means;

wherein said electronic apparatus is disposed in an upper part of said housing in a side-by-side relationship with respect to said chamber, said cooling medium supplying means being disposed beneath said chamber, and said discharge chamber being provided on an upper side of said electronic apparatus and between nozzles through which said cooling medium is supplied to the respective heat sinks, and wherein said housing is provided with a cooling medium outlet formed in an upper wall thereof.

10. A computer according to claim 9, wherein a breadth of each of said nozzles, as measured in said direction of the flow and discharge of said cooling medium determined by said heat sink is less than a breadth of a heat sink associated with the respective nozzles.

* * * * *